United States Patent
Nakamura et al.

(10) Patent No.: US 12,099,224 B2
(45) Date of Patent: Sep. 24, 2024

(54) OPTICAL LAMINATE, POLARIZING PLATE, AND IMAGE DEVICE DISPLAY

(71) Applicant: FUJIFILM Corporation, Tokyo (JP)

(72) Inventors: Yuki Nakamura, Kanagawa (JP); Shuntaro Ibuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/327,736

(22) Filed: Jun. 1, 2023

(65) Prior Publication Data
US 2023/0305209 A1    Sep. 28, 2023

Related U.S. Application Data

(63) Continuation of application No. PCT/JP2021/045402, filed on Dec. 9, 2021.

(30) Foreign Application Priority Data

Dec. 11, 2020  (JP) ................ 2020-205687
Jun. 21, 2021  (JP) ................ 2021-102715

(51) Int. Cl.
   *G02B 5/30*    (2006.01)
   *G02F 1/1337*  (2006.01)
   (Continued)

(52) U.S. Cl.
   CPC ..... *G02B 5/3016* (2013.01); *G02F 1/133719* (2013.01); *C09K 2323/02* (2020.08);
   (Continued)

(58) Field of Classification Search
   CPC ............................................ G02B 5/3016
   See application file for complete search history.

(56) References Cited

U.S. PATENT DOCUMENTS

2019/0162889 A1   5/2019   Delbaere et al.
2020/0079885 A1   3/2020   Tamura et al.
(Continued)

FOREIGN PATENT DOCUMENTS

JP   2008-276165 A   11/2008
JP   2014-215360 A   11/2014
(Continued)

OTHER PUBLICATIONS

International Search Report issued in PCT/JP2021/045402 on Mar. 1, 2022.
(Continued)

*Primary Examiner* — Sophie Hon
(74) *Attorney, Agent, or Firm* — Edwards Neils LLC; Jean C. Edwards, Esq.

(57) ABSTRACT

An optical laminate includes two optically anisotropic layers, an A-plate and a C-plate, in which the adhesiveness between the layers, the liquid crystal alignment of the C-plate, and the adhesiveness between the A-plate and a pressure-sensitive adhesive, are excellent. The optical laminate includes first and second optically anisotropic layers which are A-plate and C-plate formed of a first and second liquid crystal compound, respectively, and a mixed layer disposed between the layers, including components derived from the first and second liquid crystal compounds, and an optical alignment compound, in which a surface energy of the first optically anisotropic layer on a side opposite to the mixed layer is 25 mN/m or more, and where a component in a depth direction is analyzed with time-of-flight type secondary ion mass spectrometry while irradiating ion beams from a surface of the optical laminate on the first, toward the second, optically anisotropic layer.

13 Claims, 1 Drawing Sheet

(51) Int. Cl.
    *G02F 1/1335* (2006.01)
    *H10K 59/80* (2023.01)

(52) U.S. Cl.
    CPC .. *C09K 2323/031* (2020.08); *G02F 1/133541* (2021.01); *H10K 59/8793* (2023.02)

(56) References Cited

U.S. PATENT DOCUMENTS

| | | |
|---|---|---|
| 2020/0292861 A1 | 9/2020 | Iwasaki et al. |
| 2022/0404535 A1 | 12/2022 | Nozoe et al. |

FOREIGN PATENT DOCUMENTS

| | | |
|---|---|---|
| JP | 2019-522245 A | 8/2019 |
| WO | 2018/216812 A1 | 11/2018 |
| WO | 2019/124439 A1 | 6/2019 |
| WO | 2021/013780 A1 | 1/2021 |
| WO | 2021/167075 A1 | 8/2021 |

OTHER PUBLICATIONS

Written Opinion issued in PCT/JP2021/045402 on Mar. 1, 2022.
International Preliminary Report on Patentability completed by WIPO on Jun. 13, 2023 in connection with International Patent Application No. PCT/JP2021/045402.
Kei Fukuhara et al., Free-Surface Molecular Command Systems for Photoalignment of Liquid Crystalline Materials, Nature Communications, Feb. 18, 2014, Macmillan Publishers Ltd.

OPTICAL LAMINATE, POLARIZING PLATE, AND IMAGE DEVICE DISPLAY

CROSS-REFERENCE TO RELATED APPLICATIONS

This application is a Continuation of PCT International Application No. PCT/JP2021/045402 filed on Dec. 9, 2021, which was published under PCT Article 21(2) in Japanese, and which claims priority under 35 U.S.C. § 119(a) to Japanese Patent Application No. 2020-205687 filed on Dec. 11, 2020 and Japanese Patent Application No. 2021-102715 filed on Jun. 21, 2021. The above applications are hereby expressly incorporated by reference, in their entirety, into the present application.

BACKGROUND OF THE INVENTION

1. Field of the Invention

The present invention relates to an optical laminate, a polarizing plate, and an image display device.

2. Description of the Related Art

An optically anisotropic layer is used in various image display devices from the viewpoints of elimination of image coloration, expansion of a viewing angle, and the like.

A layer formed of a liquid crystal compound has been proposed as the optically anisotropic layer.

From the viewpoint of simplifying a process, it is preferable that a positive A-plate is manufactured without subjecting a substrate to an alignment treatment such as a rubbing treatment.

For example, Nature Communications, 2014, Vol. 5, No. 3320, p. 1-8 discloses that a positive A-plate can be manufactured without subjecting a surface of a solid substrate to any modification, using a photo-alignment compound segregated toward an air side.

SUMMARY OF THE INVENTION

On the other hand, in recent years, in a case where a plurality of optically anisotropic layers are laminated and used, it is required to improve the adhesiveness between the optically anisotropic layers.

The present inventors have evaluated the adhesiveness between two optically anisotropic layers obtained by further laminating an optically anisotropic layer (C plate) on the optically anisotropic layer (positive A-plate) described in Nature Communications, 2004, Vol. 5, No. 3320, p. 1-8, and have thus found that it is necessary to further improve the adhesiveness.

Furthermore, in order to improve the adhesiveness, it is required that the alignment properties of the liquid crystal compound in the optically anisotropic layer are also be good. In particular, it is also required that the alignment properties of the liquid crystal compound constituting the C-plate are be good. Hereinafter, an excellent alignment of the liquid crystal compound in each layer is also referred to as excellent liquid crystal alignment properties.

In addition, in an optical laminate including an A-plate, there are many cases where the optical laminate is bonded to another member on the A-plate side through a pressure-sensitive adhesive. Therefore, in a case where the A-plate is bonded through a pressure-sensitive adhesive on the side where the A-plate is arranged, it is required that the adhesiveness between the A-plate and the pressure-sensitive adhesive is excellent. Hereinafter, an excellent adhesiveness between the A-plate in the optical laminate and the pressure-sensitive adhesive is simply referred to as an excellent adhesiveness of the optical laminate.

In view of the circumstances, an object of the present invention is to provide an optical laminate including two optically anisotropic layers, that is, an A-plate and a C-plate, in which the adhesiveness between the two optically anisotropic layers is excellent, the liquid crystal alignment of the C-plate which is an optically anisotropic layer is excellent, and the adhesiveness between the A-plate and a pressure-sensitive adhesive is excellent.

In addition, another object of the present invention is to provide a polarizing plate and an image display device.

The present inventors have conducted intensive studies to solve the problems, and have thus completed the present invention having the following configurations.

[1] An optical laminate comprising:
a first optically anisotropic layer formed of a first liquid crystal compound;
a second optically anisotropic layer formed of a second liquid crystal compound; and
a mixed layer disposed between the first optically anisotropic layer and the second optically anisotropic layer, the mixed layer including a component derived from the first liquid crystal compound and a component derived from the second liquid crystal compound,
in which the first optically anisotropic layer is an A-plate,
a surface energy of a surface of the first optically anisotropic layer on a side opposite to a mixed layer side is 25 mN/m or more,
the second optically anisotropic layer is a C-plate,
the mixed layer further includes a photo-alignment compound, and
conditions which will be described later are satisfied in a case where a component in a depth direction of the optical laminate is analyzed with time-of-flight type secondary ion mass spectrometry while irradiating ion beams from a surface of the optical laminate on a first optically anisotropic layer side toward the second optically anisotropic layer side.

[2] The optical laminate as described in [1],
in which in a case where a position in a middle of the first position and the second position is defined as a third position, and in a case where a depth position which is located between the first position and the second position and is on a second position side from the third position is defined as a specific depth position,
secondary ions derived from the first liquid crystal compound and the second liquid crystal compound are detected at any depth position in a region between the first position and the specific depth position.

[3] The optical laminate as described in [1] or [2],
in which a thickness of the mixed layer is 1 to 1,000 nm.

[4] The optical laminate as described in any one of [1] to [3],
in which a thickness of the mixed layer is 10 to 500 nm.

[5] The optical laminate as described in any one of [1] to [4],
in which the photo-alignment compound in the mixed layer has a horizontal alignment function.

[6] The optical laminate as described in any one of [1] to [5],
in which the first liquid crystal compound and the second liquid crystal compound are liquid crystal compounds having a polymerizable group.

[7] A polarizing plate comprising:
the optical laminate as described in any one of [1] to [6]; and a polarizer.

[8] An image display device comprising:
the optical laminate as described in any one of [1] to [6] or the polarizing plate as described in [7].

According to the present invention, it is possible to provide an optical laminate including two optically anisotropic layers, that is, an A-plate and a C-plate, in which the adhesiveness between the two optically anisotropic layers is excellent, the liquid crystal alignment of the C-plate which is an optically anisotropic layer is excellent, and the adhesiveness between the A-plate and a pressure-sensitive adhesive is excellent.

In addition, according to the present invention, it is also possible to provide a polarizing plate and an image display device.

DESCRIPTION OF THE PREFERRED EMBODIMENTS

Figure 1:
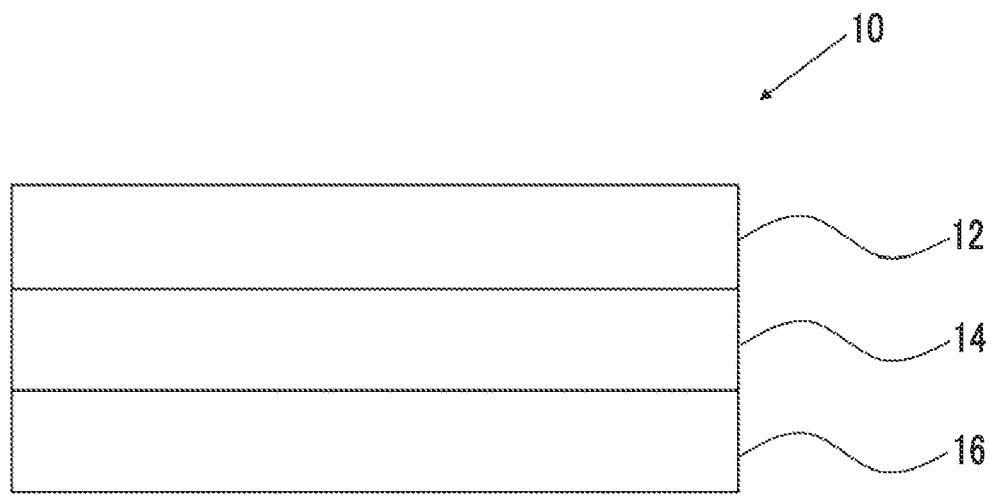
FIG. 1 is a conceptual view showing an example of an optical laminate.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In the present invention, Re($\lambda$) and Rth($\lambda$) represent an in-plane retardation and a thickness-direction retardation at a wavelength of $\lambda$, respectively. The wavelength of $\lambda$ refers to 550 nm unless otherwise specified.

In the present invention, Re($\lambda$) and Rth($\lambda$) are values measured at the wavelength $\lambda$ in AxoScan and Axometrics. By inputting an average refractive index (($n_x+n_y+n_z$)/3) and a film thickness (d (μm)) to AxoScan, the values can be calculated:

Slow axis direction (°)

Re($\lambda$)=R0($\lambda$)

Rth($\lambda$)=(($n_x+n_y$)/2−$n_z$)×d.

Furthermore, R0($\lambda$) is displayed as a numerical value calculated by AxoScan, but means Re($\lambda$).

In the present specification, the refractive indices, $n_x$, $n_y$, and $n_z$ are measured with an Abbe refractometer (NAR-4T, manufactured by Atago Co., Ltd.), using a sodium lamp ($\lambda$=589 nm) as a light source. In addition, in a case where wavelength dependency is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

"Light" in the present specification means actinic rays or radiation, and means, for example, a bright line spectrum of a mercury lamp, far ultraviolet rays typified by an excimer laser, extreme ultraviolet rays (EUV light), X-rays, ultraviolet rays, or electron beams (EB). Among these, the ultraviolet rays are preferable.

In addition, the bonding direction of a divalent group (for example, —O—CO—) as noted in the present specification is not particularly limited, and for example, in a case where in the bond of "$L^1$-$L^2$-$L^3$", $L^2$ is —O—CO—, $L^2$ may be either *1-O—CO-*2 or *1-CO—O-*2, where *1 and *2 represent a bonding position to the $L^1$ side and a bonding position to the $L^3$ side, respectively.

Moreover, in the present specification, the A-plate is defined as follows.

The A-plate encompasses two kinds of plates, that is, a positive A-plate and a negative A-plate, and in a case where a refractive index in the slow axis direction in the film plane (a direction in which the refractive index becomes a maximum in the plane) is defined as $n_x$, a refractive index in the direction in-plane orthogonal to the in-plane slow axis is defined as $n_y$, and a refractive index in the thickness direction is defined as $n_z$, the positive A-plate satisfies a relationship of Formula (A1) and the negative A-plate satisfies a relationship of Formula (A2). In addition, in the positive A-plate, Rth represents a negative value, and in the negative A-plate, Rth represents a positive value.

$$nx>ny\approx nz \qquad \text{Expression (A1)}$$

$$ny<nx\approx nz \qquad \text{Expression (A2)}$$

Furthermore, the symbol, "$\approx$", encompasses not only a case where the both sides are completely the same as each other but also a case where the both are substantially the same as each other. With regard to the expression, "substantially the same", for example, a case where ($n_y$−$n_z$)×d (in which d is the thickness of a film) is −10 to 10 nm, and preferably −5 to 5 nm is also encompassed by "$ny\approx nz$", and a case where ($n_x$−$n_z$)×d is −10 to 10 nm, and preferably −5 to 5 nm is also encompassed by "$nx\approx nz$".

The C-plate encompasses two kinds of plates, that is, a positive C-plate and a negative C-plate, the positive C-plate satisfies the relationship of Expression (C1), and the negative C-plate satisfies the relationship of Expression (C2). Furthermore, in the positive C-plate, Rth represents a positive value, and in the negative C-plate, Rth represents a negative value.

$$nz>nx\approx ny \qquad \text{Expression (C1)}$$

$$nz<nx\approx ny \qquad \text{Expression (C2)}$$

Furthermore, the symbol, "$\approx$", encompasses not only a case where the both sides are completely the same as each other but also a case where the both are substantially the same as each other. With regard to the expression, "substantially the same", for example, a case where ($n_x$−$n_y$)×d (in which d is the thickness of a film) is 0 to 10 nm, and preferably 0 to 5 nm is also encompassed by "$nx\approx ny$".

One feature of the optical laminate of an embodiment of the present invention may be that the optical laminate has a mixed layer including a photo-alignment compound and satisfies predetermined conditions 1 and 2.

It is found that in a case where the optical laminate satisfies the conditions 1 and 2 which will be described later, the aligning properties of the liquid crystal compound are excellent and the adhesiveness between the first optically anisotropic layer and the second optically anisotropic layer is also excellent.

Another feature of the optical laminate of the embodiment of the present invention may be that the surface energy of a surface of the first optically anisotropic layer included in the optical laminate on a side opposite to the mixed layer side (hereinafter also simply referred to as "the surface energy of the first optically anisotropic layer") is 25 mN/m or more.

It is found that in a case where the first optically anisotropic layer, which is an A-plate, in the optical laminate, is bonded to another member through a pressure-sensitive adhesive by configuring the optical laminate to have the features, the adhesiveness between the first optically anisotropic layer and the pressure-sensitive adhesive is excellent.

Hereinafter, an embodiment of the optical laminate will be described with reference to the drawings.

FIG. 1 is a schematic view showing an example of the optical laminate. An optical laminate 10 has a first optically anisotropic layer 12, a mixed layer 14, and a second optically anisotropic layer 16 in this order. The mixed layer 14 is disposed between the first optically anisotropic layer 12 and the second optically anisotropic layer 16.

Each of the first optically anisotropic layer 12 and the second optically anisotropic layer 16 is a layer formed of a liquid crystal compound, the first optically anisotropic layer 12 is an A-plate, and the second optically anisotropic layer 16 is a C-plate.

As shown in the optical laminate 10, the first optically anisotropic layer 12 and the mixed layer 14 are in direct contact with each other, and the second optically anisotropic layer 16 and the mixed layer 14 are in direct contact with each other.

The optical laminate of the embodiment of the present invention satisfies the following conditions 1 and 2 in a case where a component in a depth direction of the optical laminate is analyzed with time-of-flight type secondary ion mass spectrometry while irradiating ion beams from a surface on the first optically anisotropic layer side toward the second optically anisotropic layer side.

Condition 1: In a case where a depth position of the mixed layer, where a secondary ion intensity derived from the photo-alignment compound is maximum, is defined as a peak position, a depth position which is on the first optically anisotropic layer side from the peak position, where a secondary ion intensity that is half of the secondary ion intensity at the peak position is exhibited, is defined as a first position, a depth position on the second optically anisotropic layer side from the peak position, where a secondary ion intensity that is half of the secondary ion intensity at the peak position is exhibited, is defined as a second position, and secondary ions derived from the first liquid crystal compound and the second liquid crystal compound are detected at any depth position in a region between the first position and the second position.

Condition 2: In a case where a distance between the first position and the peak position is defined as a first distance and a distance between the second position and the peak position is defined as a second distance, a ratio of the second distance is less than 50% with respect to a total distance of the first distance and the second distance.

Hereinafter, the conditions 1 and 2 will be described in detail with reference to the drawings.

Figure 2:
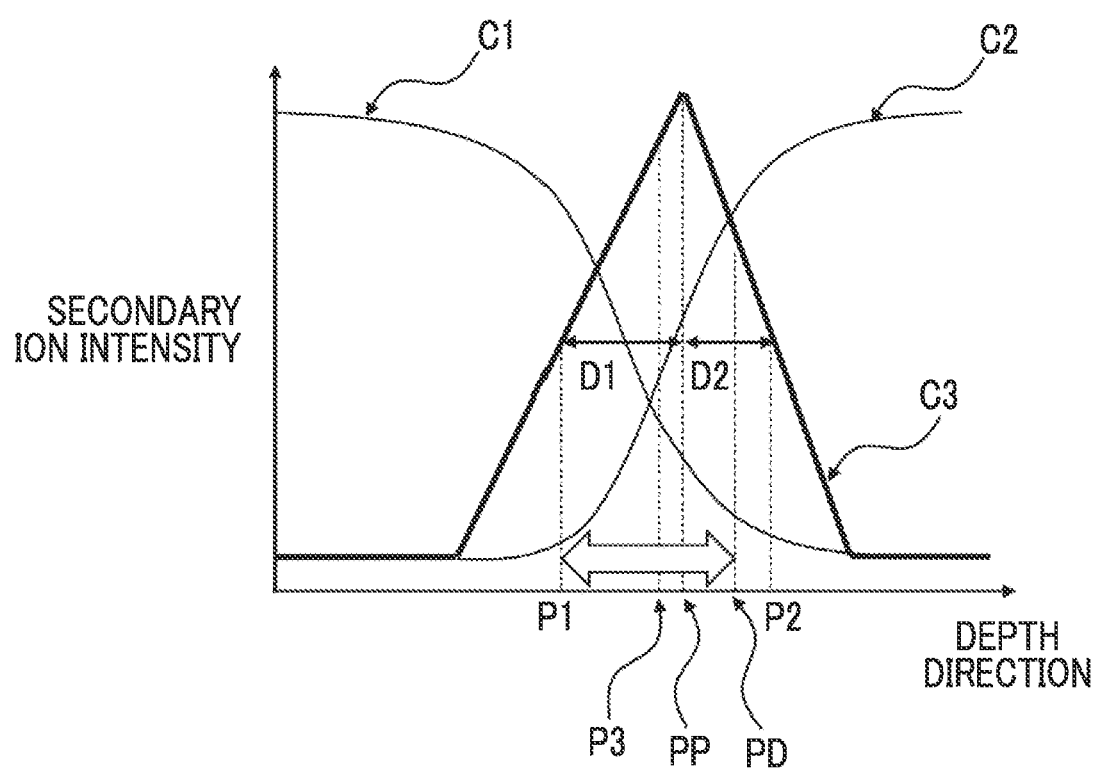
FIG. 2 is a schematic view for explaining a profile in a depth direction of a photo-alignment compound detected by analyzing a component in a depth direction of a mixed layer by time-of-flight secondary ion mass spectrometry (TOF-SIMS).

FIG. 2 shows a profile obtained by analyzing a component in a depth direction in each layer by TOF-SIMS while sputtering ions from a surface of the optical laminate 10 on the first optically anisotropic layer 12 side toward the second optically anisotropic layer 16 side. In addition, in the present specification, the depth direction is intended to be a direction toward the second optically anisotropic layer 16 side with respect to the surface of the optical laminate 10 on the first optically anisotropic layer 12 side.

In the profile in the depth direction described in FIG. 2, the horizontal axis (the axis extending in the left-right direction of the paper surface in FIG. 2) indicates a depth based on the surface of the optical laminate 10 on the first optically anisotropic layer 12 side, and the vertical axis (the axis extending in the vertical direction of the paper surface in FIG. 2) indicates the secondary ion intensity of each component.

Furthermore, the TOF-SIMS method is specifically described in "Surface Analysis Technology Library Secondary Ion Mass Spectrometry" edited by the Surface Science Society of Japan and published by Maruzen Co., Ltd. (published in 1999).

Furthermore, in a case where a component in the depth direction of the optical laminate is analyzed by TOF-SIMS while irradiating ion beams, a series of operations in which a component analysis in a surface depth region of 1 to 2 nm is performed, then excavation from 1 nm to several hundreds nm was performed, and a component analysis in the next surface depth region of 1 to 2 nm are repeated.

In the profile in the depth direction shown in FIG. 2, the results of a secondary ion intensity derived from the first liquid crystal compound (C1 in the figure), the results of a secondary ion intensity derived from the second liquid crystal compound (C2 in the figure), and the results of a secondary ion intensity derived from the photo-alignment compound (C3 in the figure) are shown.

Furthermore, in the present specification, as values determined from the profile in the depth direction detected by analyzing the component in the depth direction of the optical laminate 10 with TOF-SIMS, the "secondary ion intensity derived from the first liquid crystal compound" is intended to be an intensity of a fragment ion derived from the first liquid crystal compound, the "secondary ion intensity derived from the second liquid crystal compound" is intended to be an intensity of a fragment ion derived from the second liquid crystal compound, and the "secondary ion intensity derived from the photo-alignment compound" is intended to be an "intensity of a fragment ion derived from the photo-alignment compound.

As shown in FIG. 2, in a case where the component in a depth direction of the optical laminate 10 is analyzed with a TOF-SIMS method while irradiating ion beams from a surface of the optical laminate 10 on the first optically anisotropic layer 12 side toward the second optically anisotropic layer 16 side, first, it is observed that a secondary ion intensity derived from the first liquid crystal compound in the first optically anisotropic layer 12 is high, and in a case of further irradiating ion beams toward the depth direction, the secondary ion intensity derived from the first liquid crystal compound gradually decreases. This means that the beams reached the mixed layer 14 from the first optically anisotropic layer 12. That is, since the component derived from the first liquid crystal compound is included as a component forming a part of the mixed layer 14, the secondary ion intensity derived from the first liquid crystal compound that is lower than the secondary ion intensity derived from the first liquid crystal compound of the first optically anisotropic layer is observed. Moreover, in a case where the component in the depth direction is observed while further irradiating ion beams in the depth direction, the beams reach the second optically anisotropic layer 16 from the mixed layer 14 and the secondary ion intensity derived from the first liquid crystal compound is no longer observed.

In addition, as shown in FIG. 2, in a case where the component is analyzed from the first optically anisotropic layer 12 toward the second optically anisotropic layer 16 side, the secondary ion intensity derived from the second liquid crystal compound increases toward the optically anisotropic layer 16 side. Since the component derived from the second liquid crystal compound is included in the mixed layer 14 as mentioned above, first, the secondary ion intensity derived from the second liquid crystal compound is observed at the depth position of the mixed layer 14. Furthermore, in a case where the component is analyzed in the depth direction, the beams reach the second optically anisotropic layer 16 from the mixed layer 14, and the secondary ion intensity derived from the second liquid crystal compound is highest.

Since the component derived from the first liquid crystal compound and the component derived from the second liquid crystal compound are included in the mixed layer 14 as mentioned above, a region at a depth position where both of the secondary ion derived from the first liquid crystal compound and the secondary ion derived from the second liquid crystal compound are observed corresponds to the mixed layer 14.

As mentioned above, the secondary ion intensity derived from the first liquid crystal compound gradually decreases as it goes deeper in the depth direction in the mixed layer 14. That is, in the mixed layer 14 in the optical laminate 10 which is an embodiment of the present invention, a concentration of the component derived from the first liquid crystal compound gradually decreases from the first optically anisotropic layer 12 side toward the second optically anisotropic layer 16 side.

In addition, in the mixed layer 14, the secondary ion intensity derived from the second liquid crystal compound gradually increases as it goes deeper in the depth direction. That is, in the mixed layer 14 in the optical laminate 10 which is an embodiment of the present invention, a concentration of the component derived from the second liquid crystal compound gradually increases from the first optically anisotropic layer 12 side toward the second optically anisotropic layer 16 side.

The results of the secondary ion intensity derived from the photo-alignment compound (C3 in the figure) is shown in FIG. 2. Since the photo-alignment compound is included in the mixed layer 14, it is strongly observed in a region where both the secondary ion derived from the first liquid crystal compound and the secondary ion derived from the second liquid crystal compound are observed, as shown in FIG. 2.

In a profile in the depth direction shown in FIG. 2, the depth position of the mixed layer 14, where the secondary ion intensity derived from the photo-alignment compound is maximum, is defined as a peak position PP, the depth position of the mixed layer 14 on the side of the first optically anisotropic layer 12 from the peak position PP, which exhibits a secondary ion intensity that is a half of the secondary ion intensity at the peak position PP, is defined as a first position P1, and the depth position on the second optically anisotropic layer 16 side from the peak position PP, which exhibits a secondary ion intensity that is a half of the secondary ion intensity at the peak position PP, is a second position P2.

In the mixed layer 14, the secondary ion derived from the first liquid crystal compound and the secondary ion derived from the second liquid crystal compound are detected at any depth position in a region between the first position P1 and the second position P2, as defined in the condition 1. In addition, in FIG. 2, the secondary ion derived from the first liquid crystal compound and the secondary ion derived from the second liquid crystal compound are detected in the entire region between the first position P1 and the second position P2.

By satisfying such a condition 1, the adhesiveness between the first optically anisotropic layer and the second optically anisotropic layer is improved.

Further, in a case where a distance between the first position and the peak position is defined as a first distance D1 and a distance between the second position and the peak position is defined as a second distance D2 as shown in FIG. 2, a ratio of the second distance D2 with respect to a total distance of the first distance D1 and the second distance D2 is less than 50%. That is, X represented by Expression (1) is less than 50%.

$$X(\%) = \{D2/(D1+D2)\} \times 100 \qquad \text{Expression (1)}$$

Among those, the ratio is preferably less than 49%, and more preferably less than 48%. The lower limit is not particularly limited, but is often 38% or more, and more often 39% or more.

Furthermore, by satisfying the condition 2, the liquid crystal alignment properties of the C-plate which is the second optically anisotropic layer 16 are excellent. The expression that X is less than 50% means that a large amount of the photo-alignment compound included in the mixed layer 14 is present on the first optically anisotropic layer 12 side. The photo-alignment compound in the mixed layer 14 has a horizontal alignment function. Therefore, by allowing a larger amount of the photo-alignment compound to be present on the side of the first optically anisotropic layer 12 which is the A-plate, disposed under the mixed layer 14, good aligning properties of the second liquid crystal compound constituting the C-plate can be maintained.

Moreover, by allowing the photo-alignment group of the photo-alignment compound in the mixed layer 14 to be aligned in a predetermined direction, the photo-alignment compound of the mixed layer 14 has a horizontal alignment function.

That is, the mixed layer 14 has a function of horizontally aligning the liquid crystal compounds located adjacent to each other, based on the function of the photo-alignment compound, and can function as a so-called horizontally aligned film. The horizontally aligned film is a film having a property that liquid crystal molecules arranged on the surface thereof are horizontally aligned with respect to the surface of the horizontally aligned film.

Furthermore, from the viewpoint that at least one of an effect that the adhesiveness between the first optically anisotropic layer and the second optically anisotropic layer is more excellent or an effect that the liquid crystal alignment properties of the C-plate, which is the second optically anisotropic layer, is more excellent can be obtained (hereinafter also simply referred to as "the viewpoint that a first effect of the present invention is more excellent"), it is preferable that in a case where a position in the middle of the first position and the second position is defined as a third position and a depth position which is located between the first position and the second position and is on the second position side from the third position is defined as a specific depth position, secondary ions derived from the first liquid crystal compound and the second liquid crystal compound are detected at any depth position in a region between the first position and the specific depth position.

Hereinafter, the aspect will be described in detail with reference to FIG. 2. A position in the middle of the first position P1 and the second position P2 is referred to as a third position P3. In addition, a depth position which is located between the first position P1 and the second position P2, and is on the second position P2 side from the third position P3, as shown in FIG. 2, is defined as a specific depth position PD. In this aspect, it is preferable that the secondary ion derived from the first liquid crystal compound and the secondary ion derived from the second liquid crystal compound are detected at any depth position in a region between the first position P1 and the specific depth position PD, indicated by a white arrow in FIG. 2.

In other words, it is preferable that the secondary ion derived from the first liquid crystal compound and the secondary ion derived from the second liquid crystal compound are detected at any position in a region between the first position P1 and the third position P3 and in any position in a region between the third position P3 and the specific depth position PD.

Furthermore, the position of the specific depth position PD (depth position) only needs to be a position on the second position P2 from the third position P3, and the position is not particularly limited. Among these, it is preferable that the specific depth position is the second position P2 from the viewpoint that the first effect of the present invention is more excellent. That is, it is more preferable that the secondary ion derived from the first liquid crystal compound and the secondary ion derived from the second liquid crystal compound are detected at any position in the region between the first position P1 and the second position P2.

In addition, in the embodiment of the optical laminate described above, the first optically anisotropic layer 12 in the optical laminate 10 shown in FIG. 1 is an A-plate, and the surface energy of a surface on a side opposite to the mixed layer 14 of the first optically anisotropic layer 12 is 25 mN/m or more. Among these, from the viewpoint that the adhesiveness between the A-plate which is the first optically anisotropic layer 12 and the pressure-sensitive adhesive is more excellent (hereinafter also simply referred to as "the viewpoint that the second effect of the present invention is more excellent", the surface energy is preferably 30 mN/m or more, and more preferably 40 mN/m or more. The upper limit of the surface energy is not particularly limited, but is often 70 mN/m or less, and more often 60 mN/m or less.

A method for measuring the surface energy will be described in detail later.

Hereinafter, the members (the first optically anisotropic layer, the mixed layer, and the second optically anisotropic layer) included in the optical laminate will be described in detail.

<First Optically Anisotropic Layer>

The first optically anisotropic layer is a layer formed of the first liquid crystal compound.

The first optically anisotropic layer corresponds to an A-plate. The first optically anisotropic layer may be either a positive A-plate or a negative A-plate.

The surface energy of the surface of the first optically anisotropic layer on the side opposite to the mixed layer side is 25 mN/m or more. The surface energy of the first optically anisotropic layer will be described in detail later.

The first optically anisotropic layer is preferably a layer on which an aligned first liquid crystal compound is immobilized. In particular, the first optically anisotropic layer is preferably an A-plate on which an aligned first liquid crystal compound having a polymerizable group is immobilized. Examples of the immobilizing method include a curing treatment (polymerization reaction) as described in detail later.

Furthermore, in the present specification, the "immobilized" state is a state where the alignment of the liquid crystal compound is maintained. Specifically, the state is preferably a state where an immobilized alignment form can be stably maintained while the layer has no fluidity in a temperature range of usually 0° C. to 50° C., and −30° C. to 70° C. under more severe conditions and there is no change in alignment form by an external field or an external force.

Examples of the state where a liquid crystal compound is aligned (alignment state) include known alignment states such as a nematic alignment (a state where a nematic phase is formed) and a smectic alignment (a state where a smectic phase is formed).

Examples of the first liquid crystal compound include known liquid crystal compounds.

In general, the liquid crystal compounds can be classified into rod-like type liquid crystal compounds and disk-like type liquid crystal compounds according to shapes thereof. Further, the respective types can further be classified into a low-molecular-weight type and a high-molecular-weight type. The term, high-molecular-weight, generally refers to having a degree of polymerization of 100 or more (Polymer Physics-Phase Transition Dynamics, by Masao Doi, page 2, published by Iwanami Shoten, Publishers, 1992).

As the first liquid crystal compound, the rod-like liquid crystal compound or the discotic liquid crystal compound is preferable, and the rod-like liquid crystal compound is more preferable.

For the immobilization of the above-mentioned first liquid crystal compound, it is preferable to use a first liquid crystal compound having a polymerizable group.

The first liquid crystal compound having a polymerizable group preferably has two or more polymerizable groups in one molecule.

Moreover, in a case where two or more kinds of first liquid crystal compounds are used, it is preferable that at least one kind of the liquid crystal compounds has two or more polymerizable groups in one molecule.

Furthermore, after the first liquid crystal compound is immobilized by polymerization, it is no longer necessary that the first optically anisotropic layer exhibits liquid crystallinity.

In addition, a type of the polymerizable group is not particularly limited, and the polymerizable group is preferably a functional group capable of an addition polymerization reaction, and is also preferably a polymerizable ethylenically unsaturated group or a ring polymerizable group. More specifically, the polymerizable group is preferably a (meth)acryloyl group, a vinyl group, a styryl group, or an allyl group, and more preferably the (meth)acryloyl group. Moreover, the (meth)acryloyl group is a notation meaning a methacryloyl group or an acryloyl group.

As the rod-shaped liquid crystal compound, for example, the rod-shaped liquid crystal compounds described in claim 1 of JP1999-513019A (JP-H11-513019A) or paragraphs [0026] to [0098] of JP2005-289980A can be preferably used, and as the discotic liquid crystal compound, for example, the discotic liquid crystal compounds described in paragraphs [0020] to [0067] of JP2007-108732A or paragraphs [0013] to [0108] of JP2010-244038A can be preferably used, but the rod-shaped liquid crystal compound is not limited thereto.

In addition, in the present invention, the reverse wavelength dispersible liquid crystal compound can be used as the first liquid crystal compound.

Here, in the present specification, the "liquid crystal compound having reverse wavelength dispersibility" means that in a case where an in-plane retardation (Re) value at a specific wavelength (visible light range) of a phase difference film manufactured using the liquid crystal compound is measured, the Re value does not change or increases as a measurement wavelength is increased.

In addition, the liquid crystal compound having reverse wavelength dispersibility is not particularly limited as long as it is capable of forming a film having reverse wavelength dispersibility as described above, and examples of the compound represented by Formula (II) include the compounds represented by General Formula (1) described in JP2010-084032A (in particular, the compounds described in paragraphs [0067] to [0073]), the compound represented by General Formula (II) described in JP2016-053709A (in particular, the compounds described in paragraphs [0036] to [0043]), and the compounds represented by General Formula (1) described in JP2016-081035A (in particular, the compounds described in paragraphs [0043] to [0055]).

As will be described in detail later, the first optically anisotropic layer is formed of the first liquid crystal compound. In a case where the first liquid crystal compound having a polymerizable group is used, the first optically anisotropic layer includes a cured product (polymer) of the first liquid crystal compound. That is, the first optically anisotropic layer includes at least a component derived from the first liquid crystal compound. Furthermore, in the present specification, the component derived from the first liquid crystal compound is a concept including the first liquid crystal compound itself and a cured product (polymer) of the first liquid crystal compound.

A content of the component derived from the first liquid crystal compound in the first optically anisotropic layer is not particularly limited, but is preferably 60% to 100% by mass, and more preferably 80% to 100% by mass with respect to the total mass of the first optically anisotropic layer.

The first optically anisotropic layer may include other components other than the components derived from the first liquid crystal compound. The first liquid crystal compound may include a photo-alignment compound on a surface side of the mixed layer.

A thickness of the first optically anisotropic layer is not particularly limited, and is preferably 0.1 to 10 μm, and more preferably 0.5 to 5 μm.

An in-plane retardation of the first optically anisotropic layer is not particularly limited, and from the viewpoint of making the first optically anisotropic layer function as a λ/4 plate or function as a viewing angle compensation plate of a liquid crystal cell, the in-plane retardation at a wavelength of 550 nm is preferably 100 to 180 nm, and more preferably 120 to 160 nm.

As mentioned above, the surface energy of the surface of the first optically anisotropic layer on the side opposite to the mixed layer side indicates a predetermined range.

In the present specification, with regard to the surface energy, a surface energy ($\gamma_S$) of a solid calculated by Expressions (S1), (S2), and (S3) of Owns and Wendt, using a contact angle ($\theta_W$) of a water and a contact angle ($\theta_I$) of methylene iodide, is defined as the surface energy.

[Expression 1]

$$\gamma_S = \gamma_S^d + \gamma_S^h \quad (S1)$$

$$\sqrt{\gamma_S^d \cdot \gamma_W^d} + \sqrt{\gamma_S^h \cdot \gamma_W^h} = \frac{\gamma_W(1 + \cos\theta_W)}{2} \quad (S2)$$

$$\sqrt{\gamma_S^d \cdot \gamma_I^d} + \sqrt{\gamma_S^h \cdot \gamma_I^h} = \frac{\gamma_I(1 + \cos\theta_I)}{2} \quad (S3)$$

In Expression (S1), $\gamma_S^d$ represents a non-polar dispersing power component of $\gamma_S$ and $\gamma_S^h$ represents a hydrogen-bonding component of $\gamma_S$.

In Expression (S2), $\gamma_W$ represents a surface energy of water, $\gamma_W^d$ represents a non-polar dispersing power component of $\gamma_W$, and $\gamma_W^h$ represents a hydrogen-bonding component of $\gamma_W$. The values of $\gamma_W$, $\gamma_W^d$, and $\gamma_W^h$ are each known, and 72.8, 21.8, and 51.0 mN/m are used, respectively, in this order as the values.

In Expression (S3), $\gamma_I$ represents a surface energy of methylene iodide, $\gamma_I^d$ represents a non-polar dispersing power component of $\gamma_I$, and $\gamma_I^h$ represents a hydrogen-bonding component of $\gamma_I$. The values of $\gamma_I$, $\gamma_I^d$, and $\gamma_I^h$ are known, and 50.8, 49.5, and 1.3 mN/m are used, respectively, in this order as the values.

Here, the contact angle ($\theta_W$) of water and the contact angle ($\theta_I$) of methylene iodide refer to values measured based on a sessile drop method of JIS R 3257:1999.

For the measurement, LSE-ME1 (software 2win mini) manufactured by NiCK Corporation is used. Specifically, 2 μL of liquid droplets is dropped onto a surface of the first optically anisotropic layer on the side opposite to the mixed layer side of the first optically anisotropic layer, which is kept horizontal, using each liquid at room temperature of 20° C., and the contact angle at a point in time after the lapse of 20 seconds from the dropping is measured.

Furthermore, in the measurement of the contact angle of the surface of the first optically anisotropic layer on the side opposite to the mixed layer side, in a case where the surface of the first optically anisotropic layer on the side opposite to the mixed layer side is in close contact with another member, the contact angle may be measured by peeling such a member to expose the surface of the first optically anisotropic layer on the side opposite to the mixed layer side.

The surface energy of the first optically anisotropic layer can be controlled by a known method, and the method is not particularly limited. Examples of the method of controlling the surface energy include a method of adjusting a type of a component constituting the first optically anisotropic layer and/or a method of adjusting an amount ratio of the components, a method of allowing a large amount of the compound capable of expressing a desired surface energy on the surface of the first optically anisotropic layer, and a method of adjusting a laminating method for the first optically anisotropic layer and the second optically anisotropic layer.

Specifically, in order to increase the surface energy of the surface of the first optically anisotropic layer on the side opposite to the mixed layer side, a coating film of a composition for forming the first optically anisotropic layer may be formed on a support described later will be described, and then a coating film of a composition for forming the second optically anisotropic layer may be formed, thereby obtaining an optical laminate. In the manufacture of the optical laminate by the procedure, in a case where a coating film of the composition for forming the first optically anisotropic layer is formed, a compound having a small surface energy is concentrated on a gas-coating film interface, that is, a surface on a side serving as an interface with the second optically anisotropic layer or the mixed layer in a later step, and the surface energy of the surface of the first optically anisotropic layer on a side opposite to the mixed layer side can be increased. A method for producing the optical laminate will be described in detail later.

<Mixed Layer>

The mixed layer is a layer disposed between the first optically anisotropic layer and the second optically anisotropic layer. The mixed layer includes a component derived from the first liquid crystal compound and a component derived from the second liquid crystal compound. That is, the mixed layer is a layer including a main component of the first optically anisotropic layer (a component derived from the first liquid crystal compound) and a main component of the second optically anisotropic layer (a component derived from the second liquid crystal compound).

The component derived from the first liquid crystal compound is as mentioned above. The component derived from the second liquid crystal compound will be described in detail in a later section.

The mixed layer further includes a photo-alignment compound. The photo-alignment compound is mainly a compound that controls the alignment of the liquid crystal compound constituting the first optically anisotropic layer mentioned above.

The photo-alignment compound has a photo-alignment group.

The photo-alignment group is preferably a group that undergoes at least one of dimerization or isomerization by the action of light.

Specific suitable examples of the group to be dimerized by the action of light include a group having a skeleton of at least one derivative selected from the group consisting of a cinnamic acid derivative, a coumarin derivative, a chalcone derivative, a maleimide derivative, and a benzophenone derivative.

On the other hand, specific suitable examples of the group to be isomerized by the action of light include a group having a skeleton of at least one compound selected from the group consisting of an azobenzene compound, a stilbene compound, a spiropyran compound, a cinnamic acid compound, and a hydrazono-β-ketoester compound.

Among the photo-alignment groups, a photo-alignment group having a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound is preferable, and among these, from the viewpoint that the liquid crystal alignment properties of the first optically anisotropic layer are further improved, the photo-alignment group is more preferably a group having a skeleton of the cinnamon acid derivative or the azobenzene compound, still more preferably a group having a skeleton of the cinnamon acid derivative, and particularly preferably a group represented by Formula (a1).

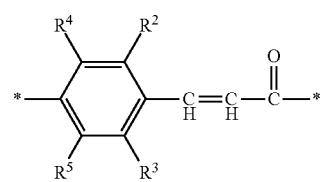

In Formula (a1), two *'s represent a bonding position, and $R^2$ to $R^5$ each independently represent a hydrogen atom or a substituent, and two adjacent groups thereof may be bonded to each other to form a ring.

In the present invention, the photo-alignment group represented by Formula (a1) is preferably a photo-alignment group represented by Formula (a2).

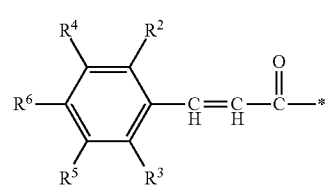

In Formula (a2), * represents a bonding position, and $R^2$ to $R^6$ each independently represent a hydrogen atom or a substituent, and two adjacent groups thereof may be bonded to each other to form a ring.

Here, from the viewpoint that the first effect of the present invention is more excellent, it is preferable that the substituents represented by one aspect of $R^2$ to $R^6$ each independently represent a halogen atom, a linear alkyl group having 1 to 20 carbon atoms, a branched or cyclic alkyl group, a linear alkyl halide group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (a3).

Furthermore, specific examples of the substituent other than the group represented by Formula (a3) include the same substituents as those described for the substituent represented by one aspect of $R^1$ in Formula (A).

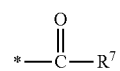

Here, in Formula (a3), * represents a bonding position with the benzene ring in Formula (a2) and $R^7$ represents a monovalent organic group.

Examples of the monovalent organic group represented by $R^7$ in Formula (a3) include a linear or cyclic alkyl group having 1 to 20 carbon atoms.

The linear alkyl group is preferably an alkyl group having 1 to 6 carbon atoms, specific examples thereof include a methyl group, an ethyl group, and an n-propyl group, and among these, the methyl group or the ethyl group is preferable.

The cyclic alkyl group is preferably an alkyl group having 3 to 6 carbon atoms, specific examples thereof include a cyclopropyl group, a cyclopentyl group, and a cyclohexyl group, and among those, the cyclohexyl group is preferable.

Furthermore, the monovalent organic group represented by $R^7$ in Formula (a3) may be a combination of a plurality of the linear alkyl group and the cyclic alkyl group mentioned above directly or through a single bond.

In the present invention, from the viewpoint that the first effect of the present invention is more excellent, it is preferable that at least one of $R^2$, ..., or $R^5$ in Formula (a1), or at least one (particularly $R^6$) of $R^2$, ..., or $R^6$ in Formula (a2) is the above-mentioned substituent, and from the viewpoint that the reaction efficiency in a case of irradiation with polarized light, it is more preferable that at least one of the groups is an electron-donating substituent.

Here, the electron-donating substituent (electron-donating group) means a substituent having a Hammett constant (Hammett substituent constant σp) of 0 or less, and example thereof include an alkyl group, an alkyl halide group, and an alkoxy group.

Among those, the alkoxy group is preferable, an alkoxy group having 6 to 16 carbon atoms is more preferable, and from the viewpoint that the first effect of the present invention is more excellent, an alkoxy group having 7 to 10 carbon atoms is still more preferable.

The photo-alignment compound is preferably a polymer.

Above all, the photo-alignment compound preferably has a repeating unit including a photo-alignment group and a repeating unit represented by Formula (III) which will be described later, and more preferably further has a repeating unit after the reaction of a crosslinkable group of a repeating unit having the crosslinkable group which will be described below.

The structure of the main chain of the repeating unit having a photo-alignment group is not particularly limited, and examples thereof include known structures. For example, a skeleton selected from the group consisting of a (meth)acryl-based skeleton, a styrene-based skeleton, a siloxane-based skeleton, a cycloolefin-based skeleton, a methylpentene-based skeleton, an amide-based skeleton, and an aromatic ester-based skeleton is preferable.

Among those, a skeleton selected from the group consisting of the (meth)acrylic-based skeleton, the siloxane-based skeleton, and the cycloolefin-based skeleton is more preferable, and the (meth)acryl-based skeleton is still more preferable.

In addition, in the repeating unit including a photo-alignment group, the photo-alignment group may be bonded to the main chain of the photo-alignment polymer through a linking group. As the linking group, a linking group including a cycloalkane ring is preferable, and a linking group including a nitrogen atom and a cycloalkane ring is more preferable.

A content of the repeating unit including the photo-alignment group in the photo-alignment compound of the present invention is not particularly limited, and from the viewpoint that the first effect of the present invention is more excellent, the content is preferably 5% to 60% by mass, more preferably 10% to 50% by mass, and still more preferably 15% to 40% by mass with respect to all the repeating units of the photo-alignment polymer.

(Repeating Unit Represented by Formula (III))

The photo-alignment polymer preferably includes a repeating unit represented by Formula (III).

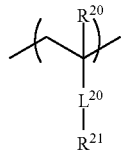
(III)

In Formula (III), $R^{20}$ represents a hydrogen atom or an alkyl group having 1 to 20 carbon atoms, and among these, the hydrogen atom or an alkyl group having 1 to 10 carbon atoms is preferable, the hydrogen atom or an alkyl group having 1 to 4 carbon atoms is more preferable, and the hydrogen atom or a methyl group is still more preferable.

In addition, in Formula (III), $L^{20}$ represents a divalent linking group selected from the group consisting of —O—, —COO—, —OCO—, a divalent aliphatic group, and a combination thereof.

Examples of the divalent aliphatic group represented by $L^{20}$ include a divalent aliphatic chain group or an aliphatic cyclic group. As the divalent aliphatic chain group, an alkylene group having 1 to 20 carbon atoms is preferable, and an alkylene group having 1 to 10 carbon atoms is more preferable. As the divalent aliphatic cyclic group, a cycloalkylene group having 3 to 20 carbon atoms is preferable, and a cycloalkylene group having 3 to 15 carbon atoms is more preferable.

Among those, as $L^{20}$, —COO— or —OCO— is preferable, and —COO— is more preferable.

In addition, in Formula (III), $R^{21}$ represents an alkyl group having 4 to 20 carbon atoms, an alkyl group having 1 to 20 carbon atoms, in which at least one hydrogen atom is substituted with a fluorine atom (hereinafter also referred to as a "fluoroalkyl group"), or a monovalent organic group including —Si($R^{a3}$)($R^{a4}$)O—, and $R^{a3}$ and $R^{a4}$ each independently represent an alkyl group, a haloalkyl group, or an aryl group.

$R^{21}$ in Formula (III) is preferably a fluoroalkyl group having 1 to 20 carbon atoms, more preferably a fluoroalkyl group having 1 to 18 carbon atoms, and still more preferably a fluoroalkyl group having 2 to 15 carbon atoms.

In addition, the number of fluorine atoms is preferably 1 to 25, more preferably 3 to 21, and still more preferably 5 to 21.

It is preferable that the repeating unit represented by Formula (III) is a repeating unit represented by Formula (IV).

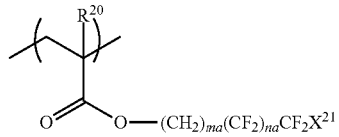
(IV)

In Formula (IV), $R^{20}$ represents a hydrogen atom or an alkyl group having 1 to 20 carbon atoms, as in $R^{20}$ in Formula (III), and a preferred embodiment thereof is also the same.

In addition, in Formula (IV), ma and na each independently represent an integer of 0 to 19. Among these, from the viewpoint of improving the adhesiveness, obtaining a raw material, and the like, ma is preferably an integer of 1 to 8, and more preferably an integer of 1 to 5. In addition, na is preferably an integer of 1 to 15, more preferably an integer of 1 to 12, still more preferably an integer of 2 to 10, and most preferably an integer of 2 to 7. It should be noted that ma and na represent an integer of 0 to 19 in total.

In addition, in Formula (IV), $X^{21}$ represents a hydrogen atom or a fluorine atom, and is preferably fluorine.

Specific examples of a monomer forming the repeating unit represented by Formula (III) or (IV) include 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluorooctyl)ethyl (meth)acrylate, 2-(perfluorodecyl)ethyl (meth)acrylate, 2-(perfluoro-3-methylbutyl)ethyl (meth)acrylate, 2-(perfluoro-5-methylhexyl)ethyl (meth)acrylate, 2-(perfluoro-7-methyloctyl)ethyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H,1H,9H-hexadecafluorononyl (meth)acrylate, 1H-1-(trifluoromethyl)trifluoroethyl (meth)acrylate, 1H,1H,3H-hexafluorobutyl (meth)acrylate, 3-perfluorobutyl-2-hydroxypropyl (meth)acrylate, 3-perfluorohexyl-2-hydroxypropyl (meth)acrylate, 3-perfluorooctyl-2-hydroxypropyl (meth)acrylate, 3-(perfluoro-3-methylbutyl)-2-hydroxypropyl (meth)acrylate, 3-(perfluoro-5-methylhexyl)-2-hydroxypropyl (meth)acrylate, and 3-(perfluoro-7-methyloctyl)-2-hydroxypropyl (meth)acrylate.

On the other hand, the monovalent organic group including —Si($R^{a3}$)($R^{a4}$)O— represented by $R^{21}$ in Formula (III) is an organic group derived from a siloxane bond, and more preferably a structure obtained by polymerizing a compound represented by Formula (VII).

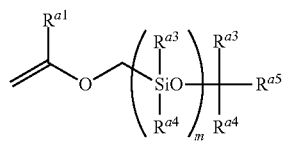

(VII)

In Formula (VII), $R^{a1}$ represents a hydrogen atom or an alkyl group having 1 to 20 carbon atoms, and $R^{a5}$ represents an alkyl group having 1 to 12 carbon atoms, and is more preferably an alkyl group having 1 to 4 carbon atoms.

In Formula (VII), $R^{a3}$ and $R^{a4}$ each independently represent an alkyl group, a haloalkyl group, or an aryl group.

The alkyl group is preferably an alkyl group having 1 to 10 carbon atoms, and examples thereof include a methyl group, an ethyl group, and a hexyl group.

The haloalkyl group is preferably a fluorinated alkyl group having 1 to 10 carbon atoms, and examples thereof include a trifluoromethyl group and a pentafluoroethyl group.

The aryl group preferably has 6 to 20 carbon atoms, and examples thereof include a phenyl group and a naphthyl group.

Among those, $R^{a3}$ and $R^{a4}$ are preferably a methyl group, a trifluoromethyl group, or a phenyl group, and more preferably the methyl group.

In Formula (VII), m represents an integer of 10 to 1,000, and is preferably an integer of 20 to 500, and more preferably an integer of 30 to 200.

Examples of the compound represented by Formula (VII) include a polysiloxane macromonomer containing a (meth)acryloyl group at one terminal (for example, SILAPLANE 0721 and SILAPLANE 0725 (both trade names, manufactured by JNC Corporation), AK-5, AK-30, and AK-32 (all trade names, manufactured by Toagosei Co., Ltd.), and KF-100T, X-22-169AS, KF-102, X-22-3701IE, X-22-164B, X-22-164C, X-22-5002, X-22-173B, X-22-174D, X-22-167B, and X-22-161AS (all trade names, manufactured by Shin-Etsu Chemical Co., Ltd.)).

A content of the repeating unit represented by Formula (III) in the photo-alignment compound of the present invention is not particularly limited, and from the viewpoint that the first effect of the present invention is more excellent, the content is preferably 5% to 95% by mass, more preferably 10% to 90% by mass, and still more preferably 20% to 80% by mass with respect to all the repeating units of the photo-alignment polymer.

A content of the component derived from the first liquid crystal compound in the mixed layer is not particularly limited, but is preferably 10% to 90% by mass, and more preferably 30% to 70% by mass with respect to the total mass of the mixed layer.

A content of the component derived from the second liquid crystal compound in the mixed layer is not particularly limited, but is preferably 10% to 90% by mass, and more preferably 30% to 70% by mass with respect to the total mass of the mixed layer.

The content of the photo-alignment compound in the mixed layer is not particularly limited, but is preferably 10% to 90% by mass, and more preferably 30% to 70% by mass with respect to the total mass of the mixed layer.

A thickness of the mixed layer is not particularly limited, but is preferably 1 to 1,000 nm, and more preferably 10 to 500 nm.

Furthermore, the thickness of the mixed layer corresponds to a depth region in which secondary ions of both the component derived from the first liquid crystal compound and the component derived from the second liquid crystal compound are observed in a case where the depth analysis of the optical laminate is performed by a TOF-SIMS method.

<Second Optically Anisotropic Layer>

The second optically anisotropic layer is a layer formed of the second liquid crystal compound.

The second optically anisotropic layer corresponds to a C-plate. The second optically anisotropic layer may be either a positive C-plate or a negative C-plate.

The second optically anisotropic layer is preferably a layer on which an aligned second liquid crystal compound is immobilized. In particular, the second optically anisotropic layer is preferably a C-plate on which an aligned second liquid crystal compound having a polymerizable group is immobilized. Examples of the immobilizing method include a curing treatment (polymerization reaction) as described in detail later.

A type of the second liquid crystal compound is not particularly limited, and examples thereof include the compounds exemplified as the first liquid crystal compound mentioned above.

A thickness of the second optically anisotropic layer is not particularly limited, and is preferably 0.1 to 10 μm, and more preferably 0.1 to 5 μm.

A retardation of the second optically anisotropic layer in the thickness direction is not particularly limited, but from the viewpoint that a reflectance in the oblique direction of a circularly polarizing plate can be reduced and a light leak in the oblique direction of a viewing angle compensation plate of a liquid crystal cell can be reduced, the retardation in the thickness direction at a wavelength of 550 nm is preferably −10 to −120 nm, and more preferably −20 to −90 nm.

A thickness of the optical laminate is not particularly limited. A total thickness of the first optically anisotropic layer, the mixed layer, and the second optically anisotropic layer mentioned above is preferably 0.2 to 10 μm, more preferably 0.5 to 5 μm, and still more preferably 1 to 4 μm.

The optical laminate may include another layer other than the first optically anisotropic layer, the mixed layer, and the second optically anisotropic layer mentioned above.

Examples of such another layer include a support.

Examples of the support include a glass substrate and a polymer film.

Examples of the material for the polymer film include cellulose-based polymers; acrylic polymers such as polymethyl methacrylate; thermoplastic norbornene-based polymers; polycarbonate-based polymers; polyester-based polymers such as polyethylene terephthalate and polyethylene naphthalate; styrene-based polymers such as polystyrene and an acrylonitrile styrene copolymer; polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

The support may be peeled after forming an optical laminate.

A thickness of the support is not particularly limited, and is preferably 5 to 200 μm, more preferably 10 to 100 μm, and still more preferably 20 to 90 μm.

<Method for Producing Optical Laminate>

A method for producing the above-mentioned optical laminate is not particularly limited, but is preferably a production method including the following steps 1 to 4 from the viewpoint that the productivity is excellent.

Step 1: A step of forming a coating film using a composition for forming a first optically anisotropic layer (hereinafter also simply referred to as a "first composition") including a first liquid crystal compound having a polymerizable group and a photo-alignment polymer having a repeating unit including a crosslinkable group causing a polymerization reaction by the action of at least one selected from the group consisting of light, heat, an acid, and a base (hereinafter also simply referred to as a "crosslinkable group-containing photo-alignment polymer")

Step 2: A step of forming a first optically anisotropic layer by subjecting the obtained coating film to a treatment of reaction with a crosslinkable group to perform polymerization (immobilization), a photo-alignment treatment, and a curing treatment of aligning and curing the first liquid crystal compound Step 3: A step of subjecting the first optically anisotropic layer obtained in the step 2 to a surface treatment Step 4: A step of forming a second optically anisotropic layer on a surface which has undergone the surface treatment of the first optically anisotropic layer, using a composition for forming a second optically anisotropic layer (hereinafter also simply referred to as "second composition") including a second liquid crystal compound having a polymerizable group In the procedure, the first optically anisotropic layer in which photo-alignment polymers are unevenly distributed on one surface is obtained by carrying out the steps 1 and 2. Thereafter, in the step 4, in a case where the second composition is applied onto a surface of the first optically anisotropic layer in which the photo-alignment polymers are unevenly distributed to form the second optically anisotropic layer, the second liquid crystal compound in the second composition permeates from the surface into the inside of the first optically anisotropic layer, and as a result, the above-described mixed layer is formed between the first optically anisotropic layer and the second optically anisotropic layer. The position where the photo-alignment polymers are unevenly distributed in the mixed layer can be adjusted by, for example, changing the conditions of the procedure in the step or by controlling the structure (for example, the type of the crosslinkable group) of the photo-alignment polymer used.

Hereinafter, the steps will be described in detail.

(Step 1)

The step 1 is a step of forming a coating film using a first composition including a first liquid crystal compound having a polymerizable group and a crosslinkable group-containing photo-alignment polymer.

The first liquid crystal compound having a polymerizable group included in the first composition is as mentioned above.

[Crosslinkable Group-Containing Photo-Alignment Polymer]

Examples of the crosslinkable group-containing photo-alignment polymer include a polymer having a repeating unit having a crosslinkable group that causes a polymerization reaction by the action of an acid (hereinafter also simply referred to as a "repeating unit B"). Examples of the crosslinkable group include an epoxy group, an epoxycyclohexyl group, and an oxetanyl group, and the crosslinkable group is preferably a cationically polymerizable group, and more preferably at least one crosslinkable group selected from the group consisting of Formulae (X1) to (X3).

(X1)

(X2)

(X3)

In Formulae (X1) to (X3), * represents a bond and $R^4$ represents a hydrogen atom, a methyl group, or an ethyl group.

As the repeating unit B, a repeating unit represented by Formula (B) is preferable from the viewpoint that the first effect of the present invention is more excellent.

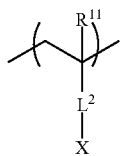

(B)

In Formula (B), $R^{11}$ represents a hydrogen atom or a methyl group, $L^2$ represents a divalent linking group, and X represents a crosslinkable group.

From the viewpoint that the first effect of the present invention is more excellent, the divalent linking group represented by $L^2$ in Formula (B) is preferably a divalent linking group (for example, —CO—O-alkylene group-) obtained by combination of at least two or more groups selected from the group consisting of a linear, branched, or cyclic alkylene group having 1 to 18 carbon atoms, which may have a substituent, an arylene group having 6 to 12 carbon atoms, which may have a substituent, an ether group (—O—), a carbonyl group (—C(=O)—), and an imino group (—NH—) which may have a substituent is preferable.

Here, examples of the substituent which may be contained in the alkylene group, the arylene group, and the imino group include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom, and the fluorine atom or the chlorine atom is preferable.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the aryl group include an aryl group having 6 to 12 carbon atoms, for example, a phenyl group, an α-methylphenyl group, and a naphthyl group, and the phenyl group is preferable.

Examples of the aryloxy group include phenoxy, naphthoxy, imidazoyloxy, benzimidazoyloxy, pyridin-4-yloxy, pyrimidinyloxy, quinazolinyloxy, purinyloxy, and thiophen-3-yloxy.

Examples of the alkoxycarbonyl group include methoxycarbonyl and ethoxycarbonyl.

Examples of the linear alkylene group having 1 to 18 carbon atoms include a methylene group, an ethylene group, a propylene group, a butylene group, a pentylene group, a hexylene group, a decylene group, an undecylene group, a dodecylene group, a tridecylene group, a tetradecylene group, a pentadecylene group, a hexadecylene group, a heptadecylene group, and an octadecylene group.

Examples of the branched alkylene group having 1 to 18 carbon atoms include a dimethylmethylene group, a methylethylene group, a 2,2-dimethylpropylene group, and a 2-ethyl-2-methylpropylene group.

Examples of the cyclic alkylene group having 1 to 18 carbon atoms include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group, and the cyclohexylene group is preferable.

Specific examples of the arylene group having 6 to 12 carbon atoms include a phenylene group, a xylylene group, a biphenylene group, a naphthylene group, and a 2,2'-methylenebisphenyl group, and the phenylene group is preferable.

Examples of the crosslinkable group represented by X in Formula (B) include the above-mentioned crosslinkable groups.

Examples of the repeating unit B include the following repeating units B-1 to B-17.

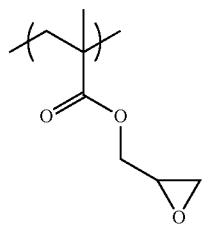

B-1

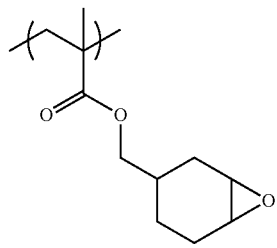

B-2

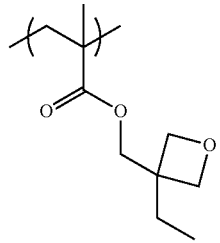

B-3

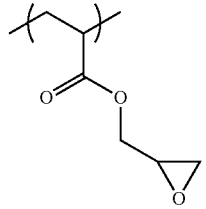

B-4

B-5 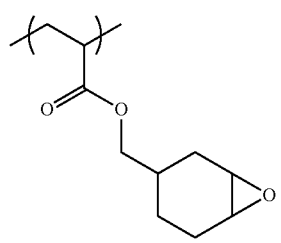
B-6 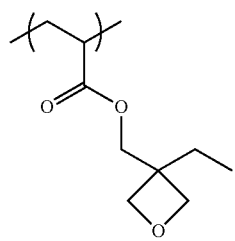
B-7 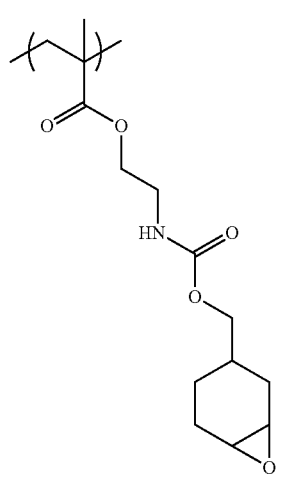
B-8 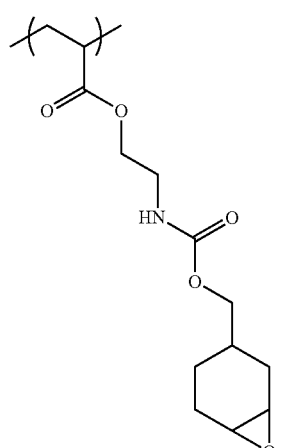
B-9 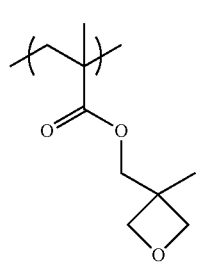
B-10 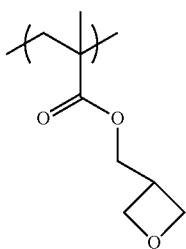
B-11 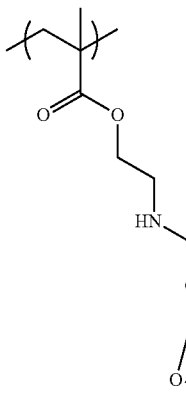
B-12 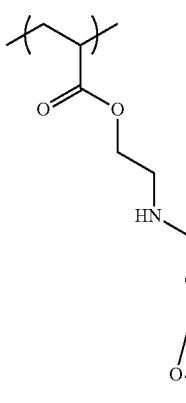
B-13 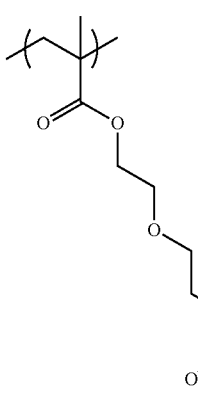

-continued

B-14
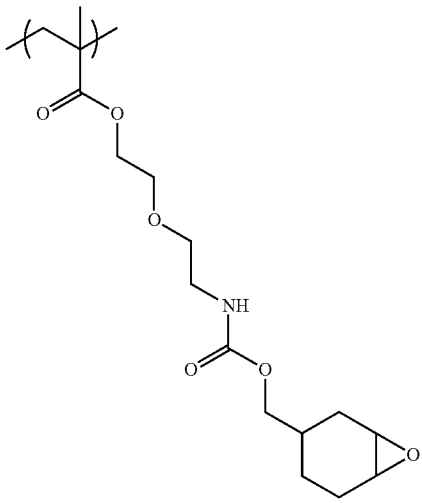

B-15
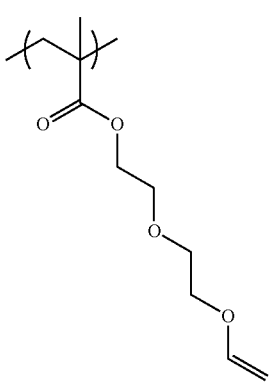

B-16
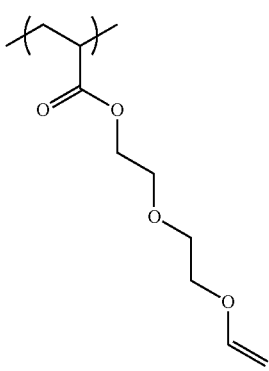

B-17
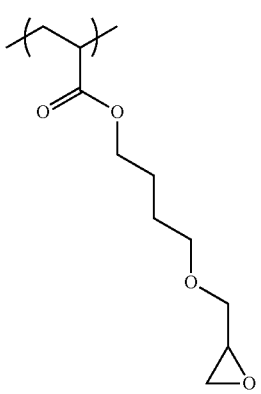

Furthermore, the crosslinkable group-containing photo-alignment polymer may include the repeating unit represented by Formula (III) (preferably the repeating unit represented by Formula (IV) or Formula (VII)). By incorporating the repeating unit represented by Formula (III) in the crosslinkable group-containing photo-alignment polymer, in a step of forming a coating film on a support, using the first composition including the crosslinkable group-containing photo-alignment polymer, as described below, the crosslinkable group-containing photo-alignment polymer is easily concentrated at a gas-coating interface. Therefore, as a result, it is difficult for the crosslinkable group-containing photo-alignment polymer to be present on a surface of the first optically anisotropic layer on the support side (the surface of the first optically anisotropic layer on the side opposite to the mixed layer side), and as a result, the surface energy increases.

The first composition may include other components other than the first liquid crystal compound having a polymerizable group and the crosslinkable group-containing photo-alignment polymer.

The first composition may include a photoacid generator.

The photoacid generator is not particularly limited, and is preferably a compound that is sensitive to actinic rays at a wavelength of 300 nm or more, and preferably a wavelength of 300 to 450 nm, and generates an acid. In addition, a photoacid generator that is not directly sensitive to actinic rays having a wavelength of 300 nm or more can also be preferably used in combination with a sensitizer as long as it is a compound that is sensitive to actinic rays at a wavelength of 300 nm or more and generates an acid by being used in combination with the sensitizer.

As the photoacid generator, a photoacid generator that generates an acid having a pKa of 4 or less is preferable, a photoacid generator that generates an acid having a pKa of 3 or less is more preferable, and a photoacid generator that generates an acid having a pKa of 2 or less is still more preferable. Moreover, in the present invention, the pKa basically refers to a pKa in water at 25° C. Those that cannot be measured in water refer to those measured by changing water to a solvent suitable for measurement. Specifically, reference can be made to the pKa described in Chemicals Handbook and the like. As the acid having a pKa of 3 or less, sulfonic acid or phosphonic acid is preferable, and sulfonic acid is more preferable.

Examples of the photo-acid generator include an onium salt compound, trichloromethyl-s-triazines, a sulfonium salt, an iodonium salt, a quaternary ammonium salt, a diazomethane compound, an imidosulfonate compound, and an oxime sulfonate compound. Among these, the onium salt compound, the imide sulfonate compound, or the oxime sulfonate compound is preferable, and the onium salt compound or the oxime sulfonate compound is more preferable. The photoacid generator may be used alone or in combination of two or more kinds thereof.

The first composition may include a polymerization initiator.

The polymerization initiator is not particularly limited, and examples thereof include a thermal polymerization initiator and a photopolymerization initiator depending on the type of the polymerization reaction.

As the polymerization initiator, a photopolymerization initiator capable of initiating a polymerization reaction upon irradiation with ultraviolet rays is preferable.

Examples of the photopolymerization initiator include α-carbonyl compounds (described in each of the specifications of U.S. Pat. Nos. 2,367,661 A and 2,367,670 A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

The first composition may include a solvent.

Examples of the solvent include ketones (for example, acetone, 2-butanone, methyl isobutyl ketone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

The solvents may be used singly or in combination of two or more kinds thereof

[Procedure of Step 1]

A method of forming a coating film using the first composition is not particularly limited, and examples thereof include a method of applying the first composition onto a support and performing a drying treatment as necessary.

The support is as mentioned above.

By applying the first composition onto the support in the step 1 as described above, the surface energy of the surface of the first optically anisotropic layer on the support side can be increased as mentioned above.

A method of applying the first composition is not particularly limited, and examples thereof include a spin coating method, an air knife coating method, a curtain coating method, a roller coating method, a wire bar coating method, a gravure coating method, and a die coating method.

(Step 2)

The step 2 is a step of forming a first optically anisotropic layer by carrying out a treatment of reacting the obtained coating film with the crosslinkable group to perform polymerization (hereinafter also simply referred to as a "crosslinking treatment"), a photo-alignment treatment, and a curing treatment of aligning and curing the first liquid crystal compound (hereinafter also simply referred to as a "curing treatment").

As the crosslinking treatment, an optimum treatment is selected depending on the type of the crosslinkable group in the crosslinkable group-containing photo-alignment polymer used. For example, in a case where the crosslinkable group in the polymer reacts by the action of an acid, the crosslinking treatment includes an acid generation treatment.

As the crosslinking treatment, the acid generation treatment is preferable from the viewpoint of productivity and ease of reaction of the crosslinkable group.

The acid generation treatment is a treatment of generating an acid from a photoacid generator or a thermal acid generator in a coating film. Specifically, the acid generation treatment is a treatment of generating an acid by irradiating light to which a photoacid generator included in the coating film is sensitive to generate an acid, or a treatment of generating an acid by applying heat. By carrying out the present treatment, a reaction with the crosslinkable group proceeds to perform crosslinking.

The light irradiation treatment carried out in the treatment may be any treatment as long as it is a treatment in which a photoacid generator is sensitive to light, and examples of the light irradiation treatment include a method of irradiation with ultraviolet rays. As the light source, a lamp that emits ultraviolet rays, such as a high-pressure mercury lamp and a metal halide lamp, can be used. In addition, the irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 to 1,000 mJ/cm$^2$.

A heat treatment carried out in the treatment may be any treatment as long as a thermal acid generator is cleaved. The temperature is preferably 50° C. or higher, more preferably 80° C. or higher, and still more preferably 110° C. or higher.

In the photo-alignment treatment, a polarized light to be irradiated is not particularly limited, and examples thereof include a linearly polarized light, a circularly polarized light, and an elliptically polarized light, and the linearly polarized light is preferable.

In addition, the "oblique direction" in which the non-polarized light is irradiated is not particularly limited as long as it is a direction tilted by a polar angle θ (0<θ<90°) with respect to the normal direction of the surface of the coating film, and can be suitably selected according to the purpose, and θ is preferably 20° to 80°.

A wavelength of the polarized light or the non-polarized light is not particularly limited as long as the light is a light to which the photo-alignment group is sensitive, and examples of the light include ultraviolet rays, near ultraviolet rays, and visible rays, and near ultraviolet rays at 250 to 450 nm are preferable.

In addition, examples of a light source for irradiating a polarized light or a non-polarized light include a xenon lamp, a high-pressure mercury lamp, an ultra-high-pressure mercury lamp, and a metal halide lamp. A wavelength range for irradiation can be limited by using an interference filter, a color filter, or the like with respect to ultraviolet rays or visible light obtained from such a light source. In addition, a linearly polarized light can be obtained by using a polarizing filter or a polarizing prism with respect to light from these light sources.

An integrated amount of the polarized light or the non-polarized light is not particularly limited, and is preferably 1 to 300 mJ/cm$^2$, and more preferably 5 to 100 mJ/cm$^2$.

An illuminance of the polarized light or the non-polarized light is not particularly limited, and is preferably 0.1 to 300 mW/cm$^2$, and more preferably 1 to 100 mW/cm$^2$.

The curing treatment is a treatment of aligning and curing the first liquid crystal compound in the coating film. By carrying out the present treatment, the aligned liquid crystal compound can be immobilized.

The treatment for aligning the first liquid crystal compound is not particularly limited and examples thereof include a heating treatment.

The conditions of the heating treatment are not particularly limited, and the heating temperature is preferably 30° C. to 120° C., and more preferably 50° C. to 100° C. The heating time is preferably 10 to 600 seconds, and more preferably 30 to 300 seconds.

Examples of the treatment for curing the aligned first liquid crystal compound include a light irradiation treatment.

The light irradiation treatment is not particularly limited, and examples thereof include a method of irradiation with ultraviolet rays. As the light source, a lamp that emits ultraviolet rays, such as a high-pressure mercury lamp and a metal halide lamp, can be used. In addition, the irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 to 1,000 mJ/cm$^2$.

The heating treatment in the acid generation treatment and the heating treatment in the alignment treatment may be carried out at the same time.

(Step 3)

The step 3 is a step of subjecting the first optically anisotropic layer obtained in the step 2 to a surface treatment.

Examples of the surface treatment include a glow discharge treatment, a corona discharge treatment (corona treatment), and an ultraviolet (UV) treatment. From the viewpoint of simplifying the production process, it is preferable that the first optically anisotropic layer and the second optically anisotropic layer are in contact with each other without using an alignment film, and specifically, it is preferable that the second optically anisotropic layer is formed on a surface which has undergone the surface treatment of the first optically anisotropic layer after the surface treatment of the first optically anisotropic layer.

The method in the surface treatment is not limited, but a corona treatment is preferable from the viewpoint of the aligning properties of the second optically anisotropic layer are further improved.

The corona treatment can be carried out by the method as disclosed in JP1993-140355A (JP-H05-140355), and the discharge amount is preferably 10 to 1,000 W·min/m$^2$, more preferably 30 to 500 W·min/m$^2$, and still more preferably 50 to 200 W·min/m$^2$.

(Step 4)

The step 4 is a step of forming a second optically anisotropic layer on a surface which has undergone the surface treatment of the first optically anisotropic layer, using a second composition including a second liquid crystal compound having a polymerizable group.

The second liquid crystal compound having a polymerizable group included in the second composition is as mentioned above.

The second composition may include other components other than the second liquid crystal compound having a polymerizable group.

Examples of such other components that may be included in the second composition include the polymerization initiator and the solvent which may be included in the first composition mentioned above, and a leveling agent.

The leveling agent may have a function of an alignment agent (vertical alignment agent) used for vertically aligning a liquid crystal compound.

The procedure of the step is not particularly limited, and examples thereof include a method in which the second composition is applied onto a surface which has been subjected to a photo-alignment treatment of the first optically anisotropic layer, and a curing treatment by aligning the second liquid crystal compound in the coating film is performed.

Examples of the method of applying the second composition include a method of applying the first composition mentioned above.

Examples of the method for aligning the second liquid crystal compound include the method for aligning the first liquid crystal compound mentioned above.

Examples of the method for curing the second liquid crystal compound include a method of curing the first liquid crystal compound mentioned above.

<Polarizing Plate>

A polarizing plate of an embodiment of the present invention has the above-mentioned optical laminate of the embodiment of the present invention and a polarizer.

In addition, in a case where the above-mentioned optical laminate of the embodiment of the present invention is a λ/4 plate, the polarizing plate of the embodiment of the present invention can be used as a circularly polarizing plate.

In a case where the polarizing plate of the embodiment of the present invention is used as a circularly polarizing plate, the optical laminate of the embodiment of the present invention is used as a λ/4 plate, and an angle formed by the slow axis of the λ/4 plate and the absorption axis of a polarizer which will be described later is preferably 30° to 60°, more preferably 40° to 50°, still more preferably 42° to 48°, and particularly preferably 45°.

In addition, the polarizing plate of the embodiment of the present invention can also be used as an optical compensation film for a liquid crystal display device in an in-plane-switching (IPS) mode or a fringe-field-switching (FFS) mode.

In a case where the polarizing plate of the embodiment of the present invention is used as an optical compensation film for an IPS mode or FFS mode liquid crystal display device, it is preferable that the above-mentioned optical laminate of the embodiment of the present invention is used as a laminate of a positive A-plate and a positive C-plate, an angle formed by the slow axis of the positive A-plate and the absorption axis of a polarizer which will be described later are orthogonal or parallel, and specifically, it is more preferable that an angle formed by the slow axis of the positive A-plate and the absorption axis of the polarizer which will be described later is 0° to 5° or 85° to 95°.

Here, the "slow axis" of the λ/4 plate or the positive A-plate means a direction in which a refractive index in the plane of the λ/4 plate or the positive A-plate is maximum, and the "absorption axis" of the polarizer means a direction in which the absorbance is highest.

(Polarizer)

A polarizer contained in a polarizing plate of the embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods described in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, a ¼ wavelength plate, and the like is used as the reflective type polarizer.

Among those, as the polarizer, a polarizer including a polyvinyl alcohol-based resin (a polymer including —CH$_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

A thickness of the polarizer is not particularly limited, but is preferably 3 to 60 μm, more preferably 3 to 30 μm, and still more preferably 3 to 10 μm.

<Image Display Device>

An image display device of an embodiment of the present invention is an image display device having the optical laminate of the embodiment of the present invention or the polarizing plate of the embodiment of the present invention.

A display element used in the image display device of the embodiment of the present invention is not particularly limited, and examples thereof include a liquid crystal cell, an organic electroluminescence (hereinafter simply referred to as "EL") display panel, and a plasma display panel.

Among those, the liquid crystal cell or the organic EL display panel is preferable, and the liquid crystal cell is more preferable. That is, as the image display device of the embodiment of the present invention, a liquid crystal display device using a liquid crystal cell as a display element or an organic EL display device using an organic EL display panel as a display element is preferable.

The liquid crystal cell used for the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but is not limited thereto.

As the liquid crystal display device which is an example of the image display device of an embodiment of the present invention, for example, an aspect in which the liquid crystal display device has a polarizer, the optical laminate of the embodiment of the present invention, and a liquid crystal cell in this order from the viewing side is preferable, and an aspect in which the liquid crystal display device has a polarizer, the above-mentioned second optically anisotropic layer, the above-mentioned first optically anisotropic layer, and a liquid crystal cell in this order is more preferable.

Suitable examples of the organic EL display device which is an example of the image display device of the embodiment of the present invention include an aspect in which a polarizer, the optical laminate of the embodiment of the present invention, and an organic EL display panel are provided in this order from the visual side.

The organic EL display panel is a member in which a light emitting layer or an organic compound thin film including a plurality of light emitting layers is formed between a pair of electrodes, an anode and a cathode, and may have a hole injection layer, a hole transport layer, an electron injection layer, an electron transport layer, a protective layer, and the like, in addition to the light emitting layer, and these layers may have each different functions. Each of various materials can be used for forming each layer.

EXAMPLES

Hereinbelow, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

Example 1

(Method for Forming First Optically Anisotropic Layer)

A composition 1 for forming an optically anisotropic layer having the following composition was prepared.

| Composition 1 for forming an optically anisotropic layer | |
|---|---|
| The following liquid crystal compound R1 | 42.00 parts by mass |
| The following liquid crystal compound R2 | 42.00 parts by mass |
| The following polymerizable compound A1 | 12.00 parts by mass |
| The following polymerizable compound A2 | 4.00 parts by mass |
| The following photopolymerization initiator S1 | 0.50 parts by mass |
| Sun Aid SI-B3A | 3.00 parts by mass |
| DIPEA (Koei Chemical Co., Ltd.) | 0.15 parts by mass |
| The following photo-alignment polymer P1 | 0.23 parts by mass |
| HISOLVE MTEM (Toho Chemical Industry Co., Ltd.) | 2.00 parts by mass |
| NK Ester A-200 (Shin Nakamura Chemical Co., Ltd.) | 1.00 part by mass |
| Methyl isobutyl ketone | 300.00 parts by mass |

Furthermore, a group adjacent to the acryloyloxy group of each of the following liquid crystal compounds R1 and R2 represents a propylene group (a group obtained by substituting a methyl group with an ethylene group), and the following liquid crystal compounds R1 and R2 each represent a mixture of regioisomers having different positions of the methyl groups.

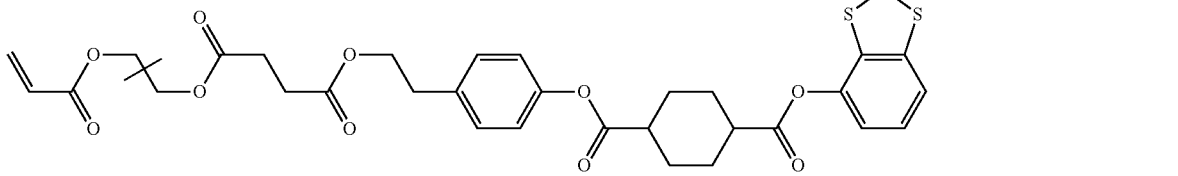

Liquid crystal compound R1

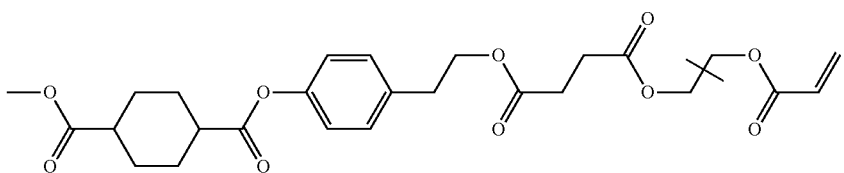
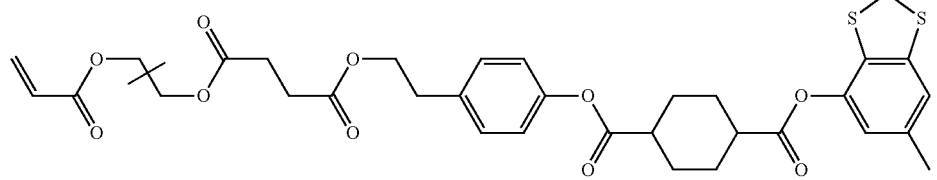
Liquid crystal compound R2
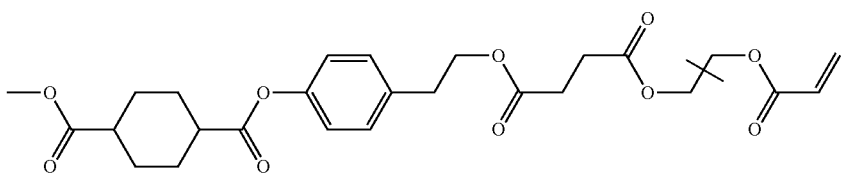
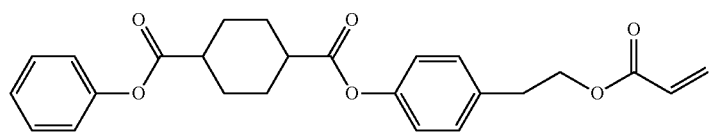
Polymerizable compound A1
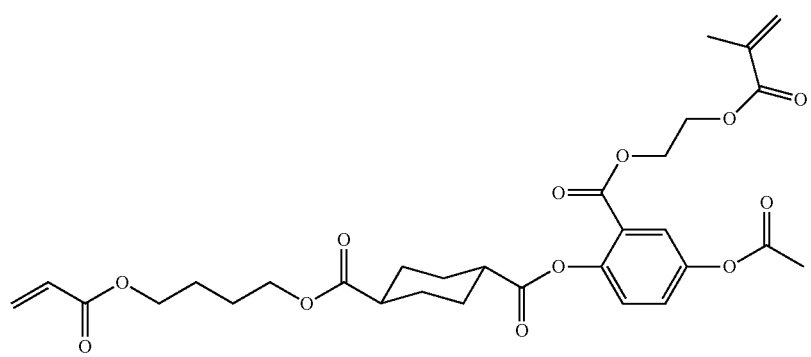
Polymerizable compound A2
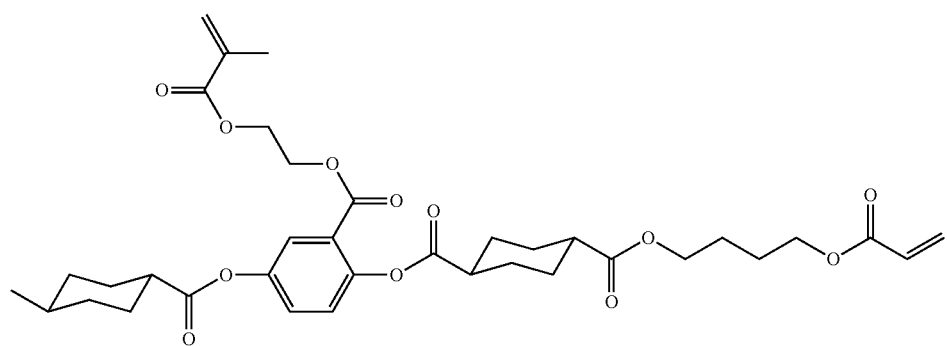

-continued

Photopolymerization initiator S1

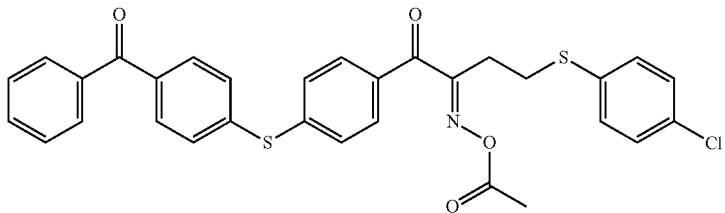

Photo-alignment Polymer P1

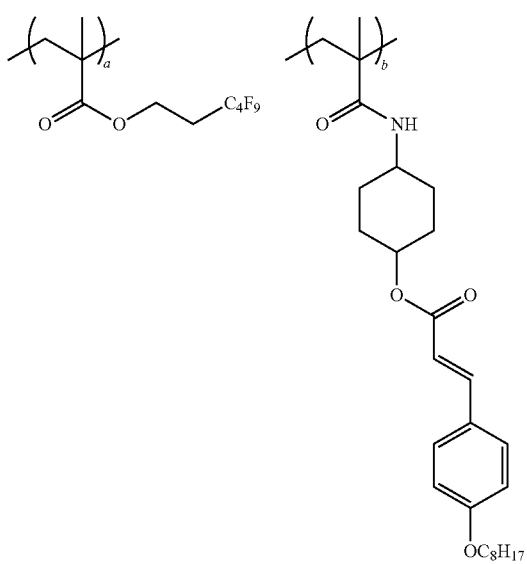

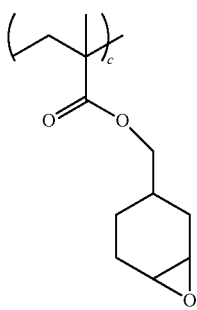

(In the following formulae, a to c satisfy a:b:c=40:10:50 and represent a content (% by mole) of each repeating unit with respect to all repeating units in the polymer.)

The composition 1 for forming an optically anisotropic layer was applied onto a cellulose acylate film (TG40UL, manufactured by Fujifilm Corporation) with a wire bar coater #7, annealed at 110° C. for 2 minutes, then cooled to room temperature, and then irradiated with UV light (ultra-high pressure mercury lamp; UL750; manufactured by HOYA) that had passed through a wire grid type polarizer at 7.9 mJ/cm² (wavelength: 313 nm).

Thereafter, the film was heated at 110° C. for 1 minute, lowered to 60° C., and irradiated with ultraviolet rays at an irradiation dose of 300 mJ/cm² using an air-cooled metal halide lamp (manufactured by Eye Graphics Co., Ltd.) at 160 mW/cm² while purging with nitrogen so as to create an atmosphere having an oxygen concentration of 1.0% by volume or less while maintaining 60° C. to form a first optically anisotropic layer (thickness: 2.5 μm). The first optically anisotropic layer was a positive A-plate satisfying Expression (A1) nx>ny≈nz.

(Surface Treatment Step)

A surface of the first optically anisotropic layer on the coating side was subjected to a corona treatment at a discharge amount of 150 W·min/m².

(Method for Forming Second Optically Anisotropic Layer)

The composition 2 for forming an optically anisotropic layer prepared with the following composition was applied onto a surface which had been subjected to a corona treatment with a wire bar coater #4.

Subsequently, heating was performed with warm air at 70° C. for 90 seconds in order to dry the solvent of the composition and subject the liquid crystal compound to alignment-aging. Under purging with nitrogen, ultraviolet irradiation (300 mJ/cm²) was performed at an oxygen concentration of 0.1% at 40° C., and the alignment of the liquid crystal compound was immobilized to manufacture a second optically anisotropic layer on the first optically anisotropic layer, thereby obtaining an optical laminate of Example 1. The obtained second optically anisotropic layer was a positive C-plate satisfying Expression (C1) nz>nx≈ny, and had a thickness of about 1.5 μm.

| Composition 2 for forming an optically anisotropic layer | |
|---|---|
| The liquid crystal compound R1 | 10.0 parts by mass |
| The liquid crystal compound R2 | 54.0 parts by mass |
| The following liquid crystal compound R3 | 28.0 parts by mass |
| The polymerizable compound A2 | 8.0 parts by mass |
| The following compound B1 | 4.5 parts by mass |
| A-600 (Shin-Nakamura Chemical Industry Co., Ltd.) | 12.0 parts by mass |
| The polymerization initiator S1 | 3.0 parts by mass |
| The following leveling agent P2 | 0.16 parts by mass |
| The following leveling agent P3 | 0.20 parts by mass |
| Methyl ethyl ketone | 225.0 parts by mass |
| Methanol | 12.5 parts by mass |
| Isopropanol | 12.5 parts by mass |

Liquid crystal compound R3

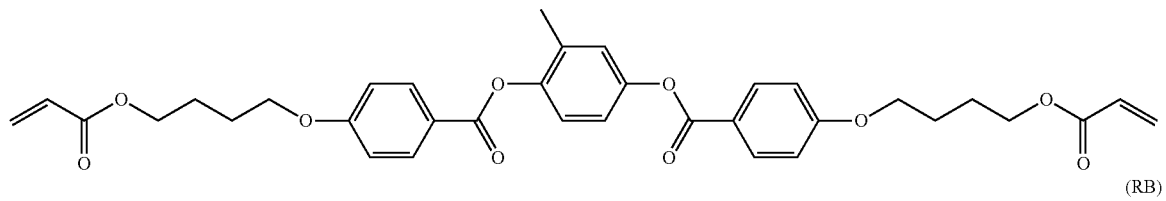
(RA)

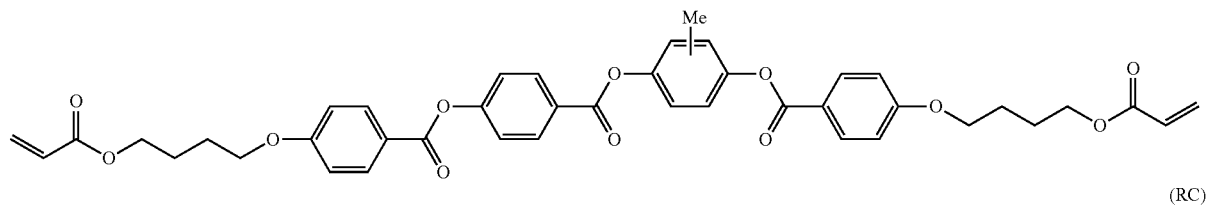
(RB)

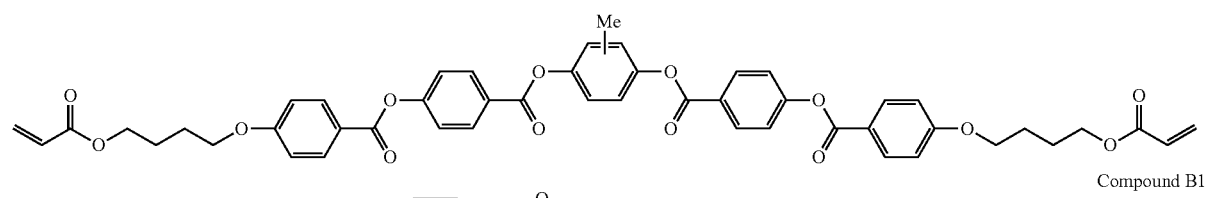
(RC)

Compound B1

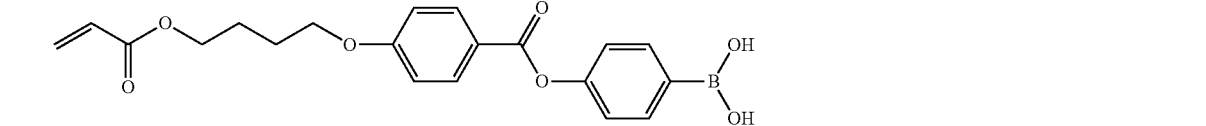

Leveling agent P2

Mw: 15k
The numerical values in the structure are % by mass.

A mixture of the following liquid crystal compounds (RA), (RB), and (RC) at ratio of 83:15:2 (mass ratio)

-continued

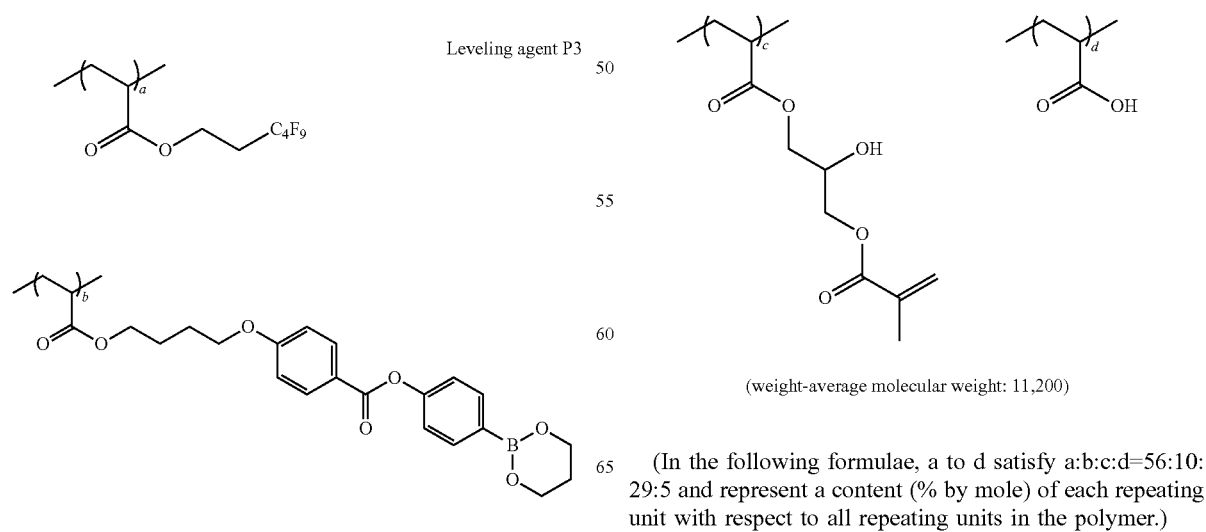

Leveling agent P3

(weight-average molecular weight: 11,200)

(In the following formulae, a to d satisfy a:b:c:d=56:10:29:5 and represent a content (% by mole) of each repeating unit with respect to all repeating units in the polymer.)

Example 2

An optical laminate of Example 2 was obtained in the same manner as in Example 1, except that the following composition 3 for forming an optically anisotropic layer was used instead of the composition 1 for forming an optically anisotropic layer, and the following composition 4 for forming an optically anisotropic layer was used instead of the composition 2 for forming an optically anisotropic layer. The first optically anisotropic layer was a positive A-plate and the second optically anisotropic layer was a positive C-plate.

| Composition 3 for forming optically anisotropic layer | |
|---|---|
| The following liquid crystal compound R4 | 27.00 parts by mass |
| The following liquid crystal compound R5 | 20.00 parts by mass |
| The following liquid crystal compound R6 | 16.50 parts by mass |
| The following liquid crystal compound R7 | 16.50 parts by mass |
| The liquid crystal compound R2 | 20.00 parts by mass |
| The following polymerizable compound A3 | 15.00 parts by mass |
| The photopolymerization initiator S1 | 0.50 parts by mass |
| Sun Aid SI-B3A | 3.00 parts by mass |
| DIPEA (Koei Chemical Co., Ltd.). | 0.15 parts by mass |
| The photo-alignment polymer P1 | 0.23 parts by mass |
| DCP (Shin-Nakamura Chemical Industry Co., Ltd.) | 3.00 parts by mass |
| Cyclopentanone | 232.00 parts by mass |
| Methyl ethyl ketone | 69.00 parts by mass |

Liquid crystal compound R4

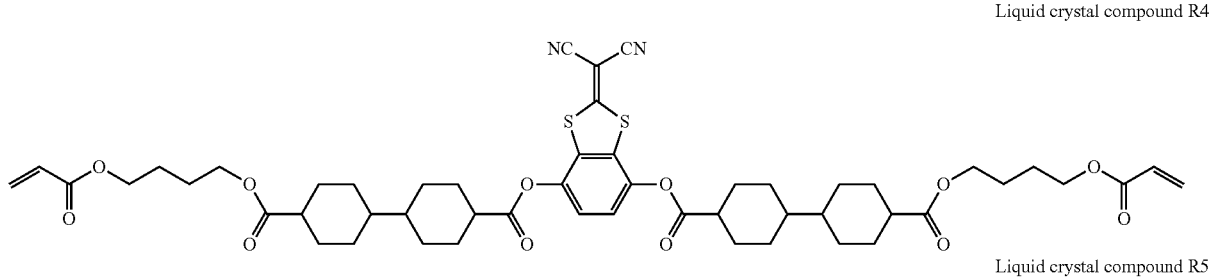

Liquid crystal compound R5

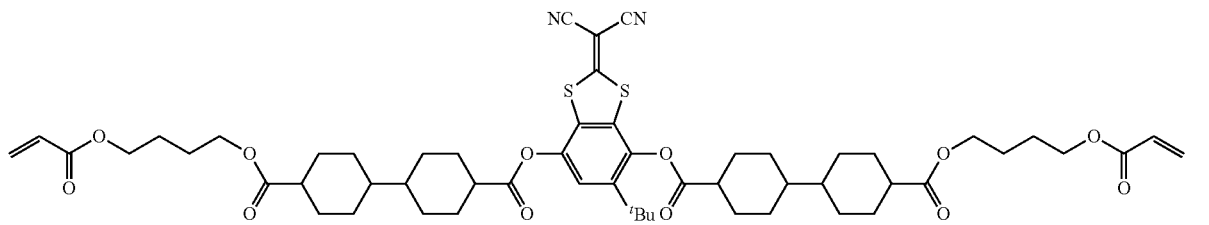

Liquid crystal compound R6

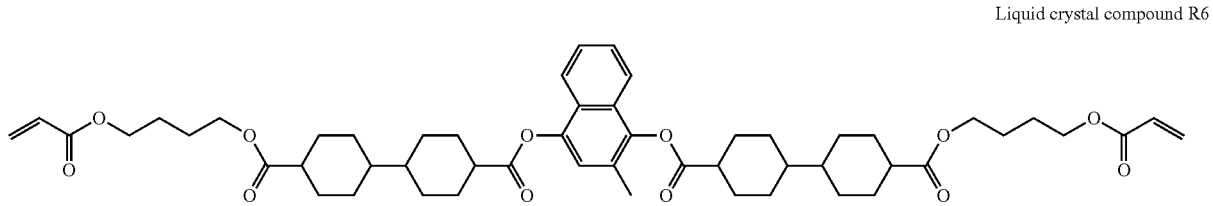

Liquid crystal compound R6

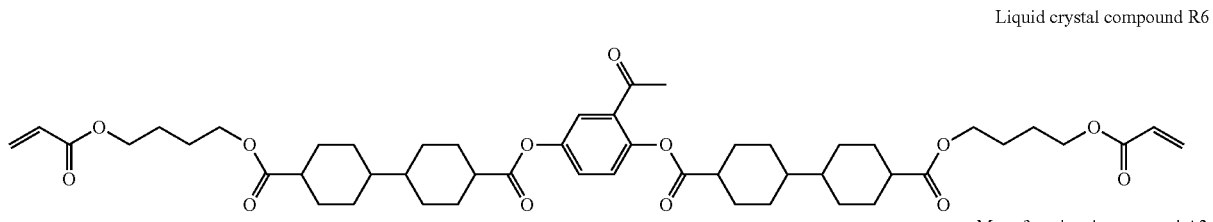

Monofunctional compound A3

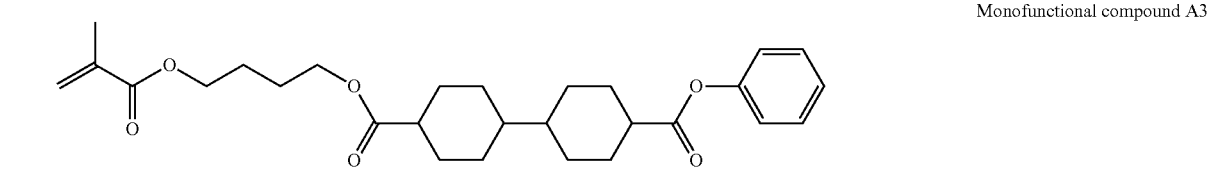

| Composition 4 for forming optically anisotropic layer | |
| --- | --- |
| The liquid crystal compound R4 | 24.8 parts by mass |
| The liquid crystal compound R5 | 24.8 parts by mass |
| The liquid crystal compound R6 | 20.2 parts by mass |
| The liquid crystal compound R7 | 20.2 parts by mass |
| The liquid crystal compound R2 | 10.0 parts by mass |
| The polymerizable compound A2 | 15.0 parts by mass |
| The compound B1 | 3.0 parts by mass |
| DPHA (Shin-Nakamura Chemical Industry Co., Ltd.) | 8.0 parts by mass |
| The photopolymerization initiator S1 | 3.0 parts by mass |
| The leveling agent P2 | 0.21 parts by mass |
| The leveling agent P3 | 0.21 parts by mass |
| Methyl ethyl ketone | 75.0 parts by mass |
| Cyclopentanone | 150.0 parts by mass |
| Methanol | 12.5 parts by mass |
| Isopropanol | 12.5 parts by mass |

Comparative Example 1

An optical laminate of Comparative Example 1 was obtained according to the same procedure as in Example 1, except that the following photo-alignment polymer PBMA-b-PAz described in Nature Communications, 2004, Vol. 5, No. 3320, p. 1-8 was used instead of the photo-alignment polymer P-1.

(In the following formula, b indicates that PBMA-b-PAz is a block polymer, and the numerical values of "510" and "144" represent the numbers of the respective repeating units.)

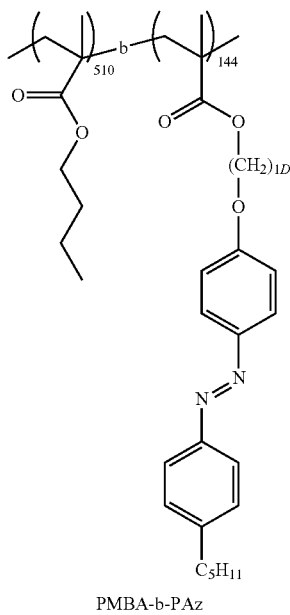

PMBA-b-PAz

<Evaluation>

The following evaluations were carried out using the optical laminates obtained in Examples and Comparative Examples.

(Liquid Crystal Alignment Properties)

Two polarizing plates were arranged on crossed nicols, the obtained optical laminate was placed between the two polarizing plates, and the degree of light leak and the planar condition were observed with a polarizing microscope and evaluated according to the following standard. The results are shown in Table 1.

AA: The liquid crystal director is uniformly arranged and aligned, and the display performance is excellent.

A: The liquid crystal director is not disturbed and the surface shape is stable.

B: Disturbance of the liquid crystal director is partial and the surface state is stable.

C: The liquid crystal director is significantly disturbed, the surface state is not stable, and thus, the display performance is extremely deteriorated.

Here, the stable planar shape is intended to be a state where there are no defects such as unevenness and defective alignment in a case where an optical laminate is placed between two polarizing plates arranged with crossed nicols and observed. In addition, the liquid crystal director is intended to be a vector in a direction (alignment main axis) in which the major axis of the liquid crystal molecule is aligned.

(Adhesiveness (Part 1))

The manufactured optical laminate was subjected to a grid pattern test (cross-cut method) quasi-applied to JIS K 5400, and the adhesiveness between the optically anisotropic layers was evaluated according to the following standard. The results are shown in Table 1.

A: In a cross-cut (100 squares) test, the remaining number is from 80 to 100

B: In a cross-cut (100 squares) test, the remaining number is 50 or more and less than 80

C: In a cross-cut (100 squares) test, the remaining number is less than 50

(Adhesiveness (Part 2))

A cellulose acetate film (Fujitac TD40UC, manufactured by Fujifilm Corporation) was immersed in an aqueous 1.5 mol/L sodium hydroxide solution (saponification solution) at a temperature controlled at 37° C. for 1 minute, and then the cellulose acetate film was washed with water. The cellulose acetate film washed with water was immersed in an aqueous 0.05 mol/L sulfuric acid solution for 30 seconds, and then further passed through a water washing bath. Then, drainage with an air knife was performed three times and the cellulose acetate film was allowed to stay in a drying zone at 70° C. for 15 seconds to dry the cellulose acetate film, thereby obtaining a saponified cellulose acetate film.

In addition, according to Example 1 of JP2001-141926A, a polarizer with a thickness of 12 μm was manufactured by providing a peripheral speed difference between two pairs of nip rolls and performing stretching in the longitudinal direction.

The following adhesive was applied onto one surface of the polarizer, and the saponified cellulose acetate film, which is a protective film, was further laminated by roll-to-roll thereonto so that the absorption axis of the polarizer and the longitudinal direction of the protective film were parallel to each other. After the lamination, the adhesive layer was cured by drying at 70° C. for 10 minutes to obtain a polarizer with a protective film.

Adhesive: 3% Aqueous Polyvinyl Alcohol (PVA-117H, Manufactured by Claret) Solution In addition, the manufactured optical laminate was cut into a size of 150 mm×25 mm.

A surface of the obtained polarizer with a protective film on a side opposite to the protective film and a surface of the cut optical laminate on the side of the second optically anisotropic layer were bonded to each other using the adhesive, and the adhesive was cured by drying at 70° C. for 10 minutes to obtain an optical laminate with a polarizer. Next, the cellulose acylate film of the optical laminate with a polarizer on the first optically anisotropic layer side was peeled, and the peeled surface and the glass substrate were bonded to each other through a pressure-sensitive adhesive (SK1478, manufactured by Soken Chemical & Engineering Co., Ltd.) to obtain a specimen. Furthermore, only in the first optically anisotropic layer, the specimen was stuck to the glass substrate through the pressure-sensitive adhesive.

The optical laminate portion with a polarizer of the specimen was peeled in a direction of 180°, and the residual amount of the pressure-sensitive adhesive on the glass substrate after the peeling was visually observed and evaluated according to the following standard. The results are shown in Table 1. Furthermore, in some cases, a peeling occurred between the first optically anisotropic layer and the second optically anisotropic layer, and the optically anisotropic layer remained on the glass substrate.

A: The area where the pressure-sensitive adhesive or the optical laminate remains is less than 20%

B: The area where the pressure-sensitive adhesive or the optical laminate remains is 20% or more and less than 80%

C: The area where the pressure-sensitive adhesive or the optical laminate remains is 80% or more As described above, the adhesiveness between the first optically anisotropic layer, which is the A-plate in the optical laminate, and the pressure-sensitive adhesive was evaluated based on the residual amount of the pressure-sensitive adhesive on the glass substrate. It is considered that in a case where the adhesiveness between the first optically anisotropic layer, which is the A-plate in the optical laminate, and the pressure-sensitive adhesive is excellent, a peeling at the interface between the pressure-sensitive adhesive and the glass substrate easily proceeds, and the residual amount of the pressure-sensitive adhesive remains on the glass substrate decreases.

In addition, the surface energy of the surface of the first optically anisotropic layer in the optical laminates of Examples 1 and 2 and Comparative Example 1 on the side opposite to the mixed layer side was measured. The measurement method was carried out according to the above-described method for measuring a surface energy.

Furthermore, in a case of measuring the surface energy of the surface of the first optically anisotropic layer on the side opposite to the mixed layer side, the cellulose acylate film was peeled from the optical laminate obtained in the procedure, and the first optically anisotropic layer was exposed to measure a contact angle.

In addition, with regard to the optical laminates of Examples 1 and 2, and Comparative Example 1, the components in the depth direction were analyzed by time-of-flight secondary ion mass spectrometry (TOF-SIMS) ("SWISS" manufactured by IONTOF GmbH) while cutting the film in the depth direction of the optical laminate with an $Ar^+$ cluster gun as mentioned above.

Furthermore, in the optical laminate of Examples 1 and 2, a profile as shown in FIG. 2 was obtained. Specifically, a mixed layer corresponding to a region in which a secondary ion derived from the first liquid crystal compound and a secondary ion derived from the second liquid crystal compound are observed were observed was observed, and in the mixed layer, the concentration of a component derived from the first liquid crystal compound gradually decreased from the first optically anisotropic layer side toward the second optically anisotropic layer side. In addition, in the mixed layer, the concentration of the component derived from the second liquid crystal compound gradually increased from the first optically anisotropic layer side to the second optically anisotropic layer side.

In the column of "Condition 1" in Table 1, a case where the above-mentioned condition 1 is satisfied is denoted as "A", and a case where the condition 1 is not satisfied is denoted as "B".

In the "Condition 2" column, a case where the above-mentioned condition 2 is satisfied is denoted as "A", and a case where the condition 2 is not satisfied is denoted as "B".

In the "Requirement 1" column, a case where secondary ions derived from the first liquid crystal compound and the second liquid crystal compound are detected at any depth position in a region between the first position and the specific depth position (here, the second position) described above is denoted as "A", and a case where at least one of the secondary ion derived from the first liquid crystal compound or the secondary ion derived from the second liquid crystal compound is not detected is denoted as "B".

Furthermore, in Examples 1 and 2, the second distance with respect to the total distance between the first distance and the second distance was 40%.

In Table 1, "-" means that the evaluation has not been performed.

TABLE 1

| | Optical laminate | | | | | | Evaluation | | |
|---|---|---|---|---|---|---|---|---|---|
| | Presence or absence of mixed layer | Thickness (nm) of mixed layer | Condition 1 | Condition 2 | Requirement 1 | Surface energy (mN/m) | Liquid crystal alignment properties | Adhesiveness (part 1) | Adhesiveness (part 2) |
| Example 1 | Presence | 40 | A | A | A | 49.0 | AA | A | A |
| Example 2 | Presence | 40 | A | A | A | 48.5 | AA | A | A |
| Comparative Example 1 | Presence | 40 | A | B | A | 48.6 | B | B | — |

As shown in Table 1 above, the optical laminate of the embodiment of the present invention exhibited a desired effect.

EXPLANATION OF REFERENCES

10: optical laminate
12: first optically anisotropic layer
14: mixed layer
16: second optically anisotropic layer

What is claimed is:
1. An optical laminate comprising:
   a first optically anisotropic layer formed of a first liquid crystal compound;
   a second optically anisotropic layer formed of a second liquid crystal compound that is different from the first liquid crystal compound; and a mixed layer in direct contact with, and disposed between, the first optically anisotropic layer and the second optically anisotropic layer, the mixed layer including a component derived from the first liquid crystal compound and a component derived from the second liquid crystal compound, wherein the first optically anisotropic layer is an A-plate, the A-plate satisfying one of two Expressions (A1) and (A2):

$$nx > ny \approx nz \quad \text{Expression (A1)}$$

$$ny < nx \approx nz \quad \text{Expression (A2)}$$

where nx is a refractive index in the slow axis direction in the layer plane (i.e., the direction in which the refractive index becomes a maximum in the plane), ny is a refractive index in the direction in-plane orthogonal to the in-plane slow axis direction, and nz is a refractive index in the layer thickness direction, a surface energy of a surface of the first optically anisotropic layer on a side opposite to a mixed layer side is 25 mN/m or more, the second optically anisotropic layer is a C-plate, the C-plate satisfying one of two Expressions (C1) and (C2):

$$nz > nx \approx ny \quad \text{Expression (C1)}$$

$$nz < nx \approx ny \quad \text{Expression (C2)}$$

the mixed layer further includes a photo-alignment compound which has a horizontal alignment function, and the following conditions are satisfied by the optical laminate in which a component in a depth direction of the optical laminate is analyzed with time-of-flight type secondary ion mass spectrometry while irradiating ion beams from a surface of the optical laminate on a first optically anisotropic layer side toward a second optically anisotropic layer side, condition 1: where a depth position in the mixed layer, at which a secondary ion intensity derived from the photo-alignment compound is maximum, is defined as a peak position, a depth position which is on the first optically anisotropic layer side from the peak position, where a secondary ion intensity that is half of the secondary ion intensity at the peak position is exhibited, is defined as a first position, and a depth position which is on the second optically anisotropic layer side from the peak position, where a secondary ion intensity that is half of the secondary ion intensity at the peak position is exhibited, is defined as a second position, secondary ions derived from the first liquid crystal compound and the second liquid crystal compound are detected at any depth position in a region between the first position and the second position, and condition 2: where a distance between the first position and the peak position is defined as a first distance and a distance between the second position and the peak position is defined as a second distance, a ratio of the second distance is less than 50% with respect to a total distance of the first distance and the second distance.

2. The optical laminate according to claim 1,
where a position in a middle of the first position and the second position is defined as a third position, and where a depth position which is located between the first position and the second position and is on a second position side from the third position is defined as a specific depth position, secondary ions derived from the first liquid crystal compound and the second liquid crystal compound are detected at any depth position in a region between the first position and the specific depth position.

3. The optical laminate according to claim 1,
wherein a thickness of the mixed layer is 1 to 1,000 nm.

4. The optical laminate according to claim 1,
wherein a thickness of the mixed layer is 10 to 500 nm.

5. The optical laminate according to claim 1,
wherein the first liquid crystal compound and the second liquid crystal compound are liquid crystal compounds having a polymerizable group.

6. A polarizing plate comprising:
the optical laminate according to claim 1; and
a polarizer.

7. An image display device comprising the optical laminate according to claim 1.

8. An image display device comprising the polarizing plate according to claim 6.

9. The optical laminate according to claim 2,
wherein a thickness of the mixed layer is 1 to 1,000 nm.

10. The optical laminate according to claim 2,
wherein a thickness of the mixed layer is 10 to 500 nm.

11. The optical laminate according to claim 2,
wherein the first liquid crystal compound and the second liquid crystal compound are liquid crystal compounds having a polymerizable group.

12. The optical laminate according to claim 3,
wherein a thickness of the mixed layer is 10 to 500 nm.

13. The optical laminate according to claim 3,
wherein the first liquid crystal compound and the second liquid crystal compound are liquid crystal compounds having a polymerizable group.

* * * * *